(12) United States Patent
Unno

(10) Patent No.: US 7,911,709 B2
(45) Date of Patent: Mar. 22, 2011

(54) APPARATUS AND METHOD FOR IMPROVING DETECTED RESOLUTION AND/OR INTENSITY OF A SAMPLED IMAGE

(75) Inventor: Yasuyuki Unno, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 1550 days.

(21) Appl. No.: 11/256,250

(22) Filed: Oct. 21, 2005

(65) Prior Publication Data

US 2007/0091386 A1 Apr. 26, 2007

(51) Int. Cl.
*G02B 9/00* (2006.01)
*G02B 9/08* (2006.01)

(52) U.S. Cl. ........................................ 359/738

(58) Field of Classification Search .......... 359/738–740, 359/652, 655, 487–488; 355/67, 71
See application file for complete search history.

(56) References Cited

U.S. PATENT DOCUMENTS 5,631,731 A 5/1997 Sogard

*Primary Examiner* — Alicia M Harrington
(74) *Attorney, Agent, or Firm* — Canon U.S.A. Inc., I.P. Division

(57) ABSTRACT

At least one exemplary embodiment is directed to a detection aperture that varies the effective aperture index of refraction or provides scattering structures to improve the detected resolution and/or intensity of a sampled image. In at least one exemplary embodiment a medium is inserted into the aperture, to match transmittance of polarization through the aperture, and to control the relative transmittance of polarizations through the aperture. In yet another exemplary embodiment structures are provided to scatter or redirect diffracted aperture light to improve detection resolution and/or intensity.

55 Claims, 23 Drawing Sheets

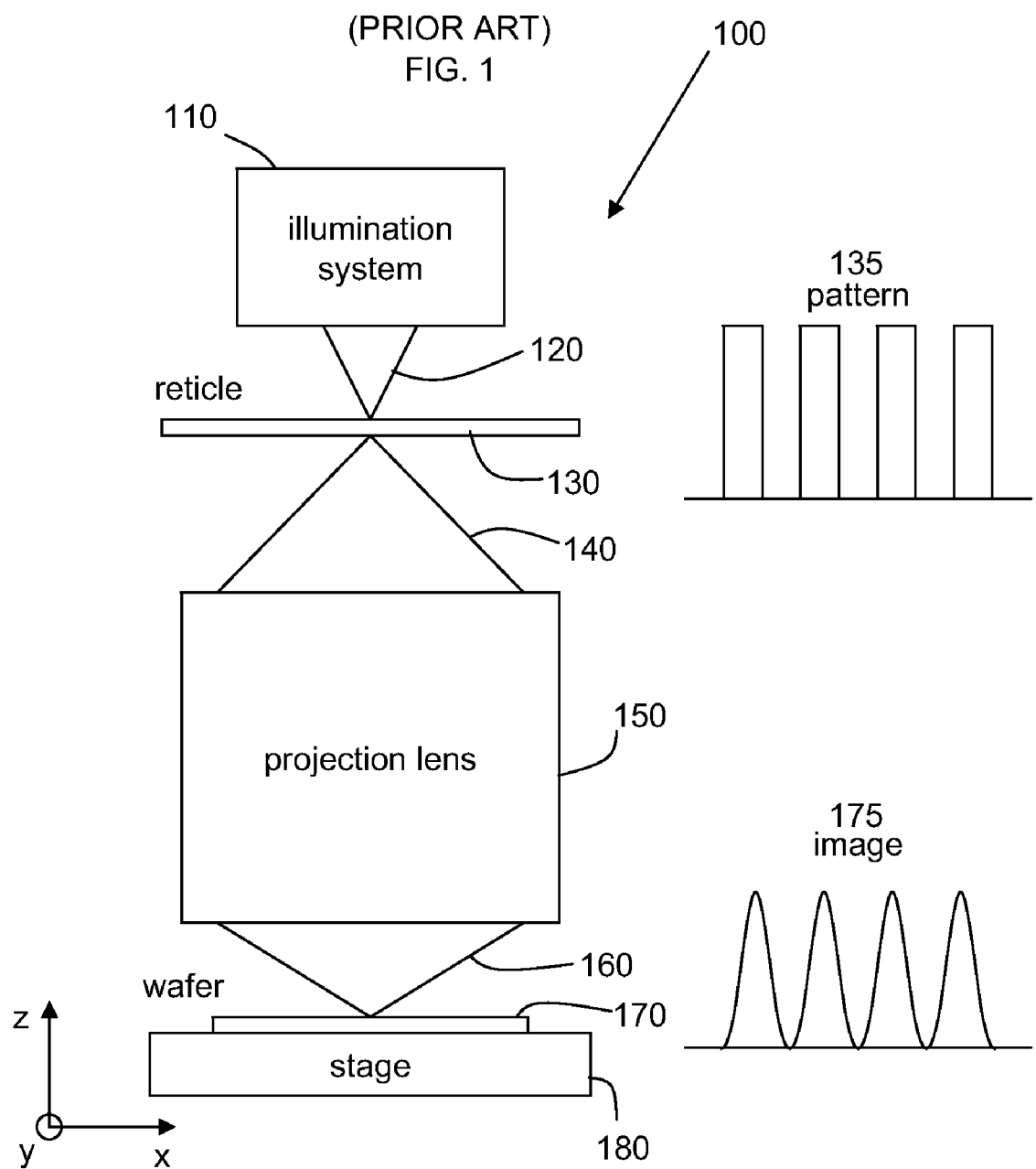

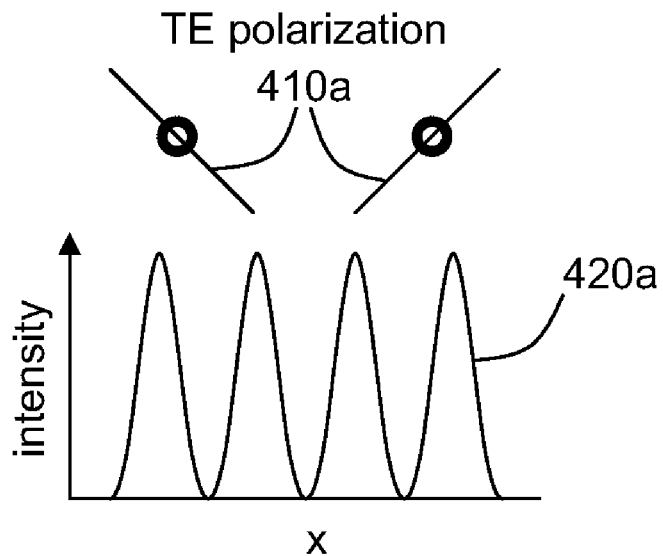
FIG. 4A (PRIOR ART)
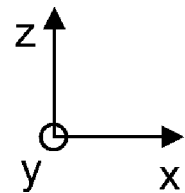
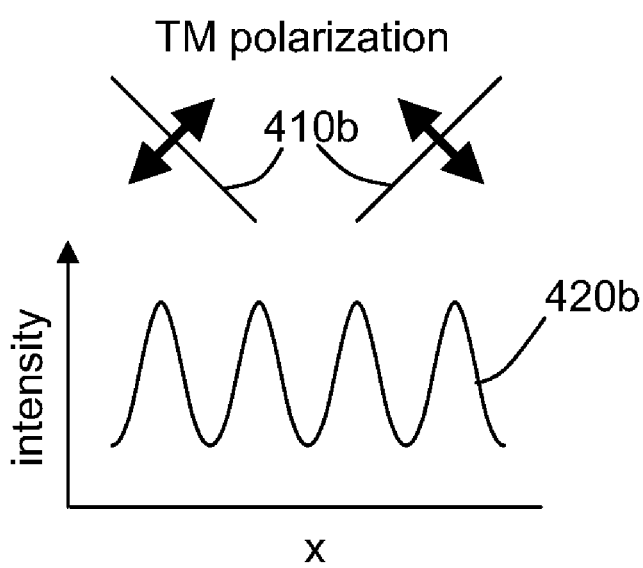
FIG. 4B (PRIOR ART)

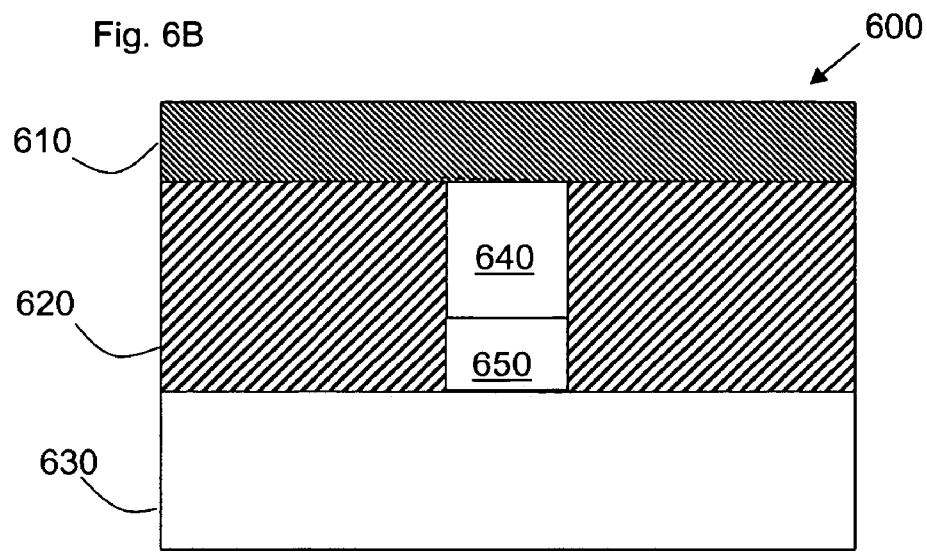
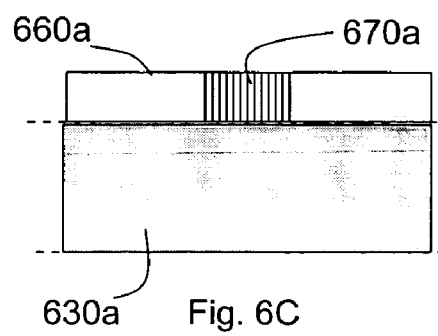
Fig. 6C
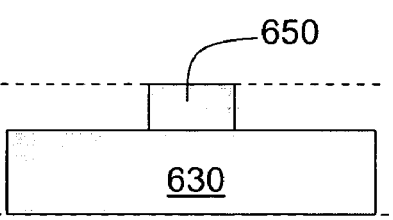
Fig. 6D
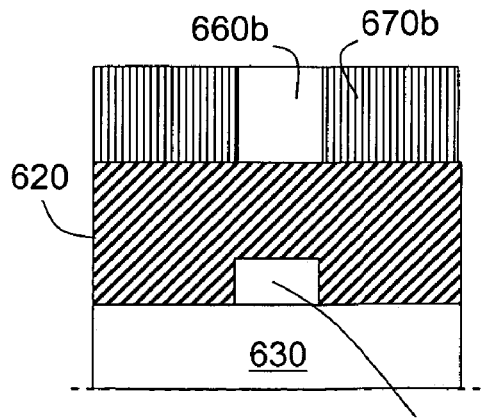
Fig. 6E
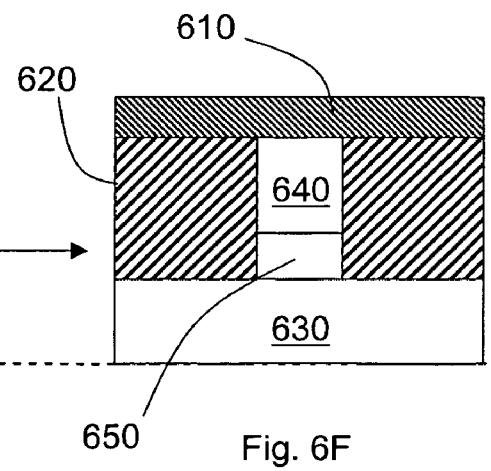
Fig. 6F FIG. 13A
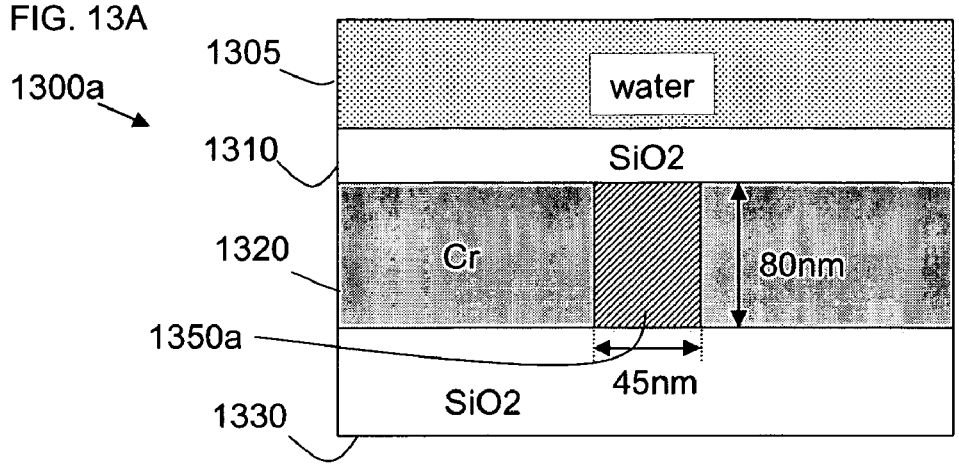
FIG. 13B
|  | Air (1350a) | SiO2 (1350a) | AlN (1350a) |
|---|---|---|---|
| TE transmittance | 0.052 | 0.523 | 0.793 |
| TM transmittance | 0.235 | 0.048 | 0.007 |
FIG. 13C
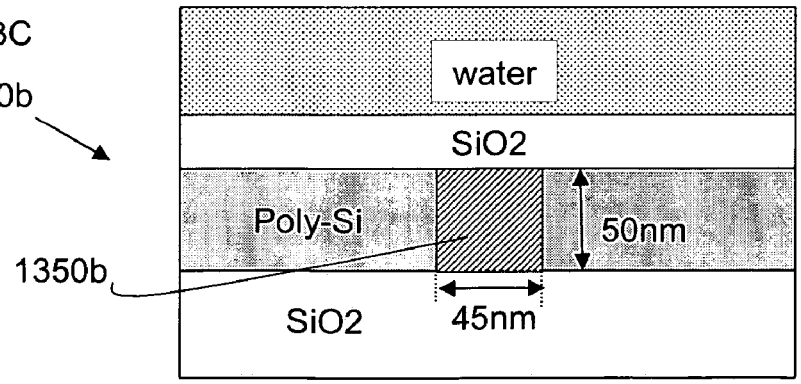
FIG. 13D
|  | Air (1350b) | SiO2 (1350b) | AlN (1350b) |
|---|---|---|---|
| TE transmittance | 0.098 | 0.488 | 0.975 |
| TM transmittance | 0.222 | 0.171 | 0.050 |

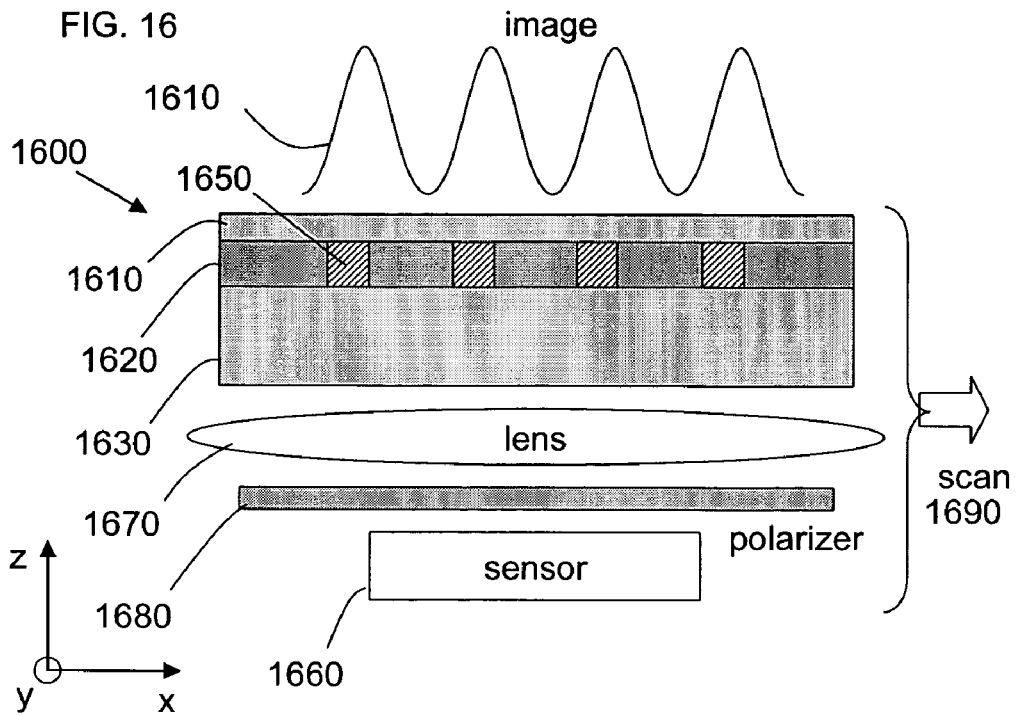
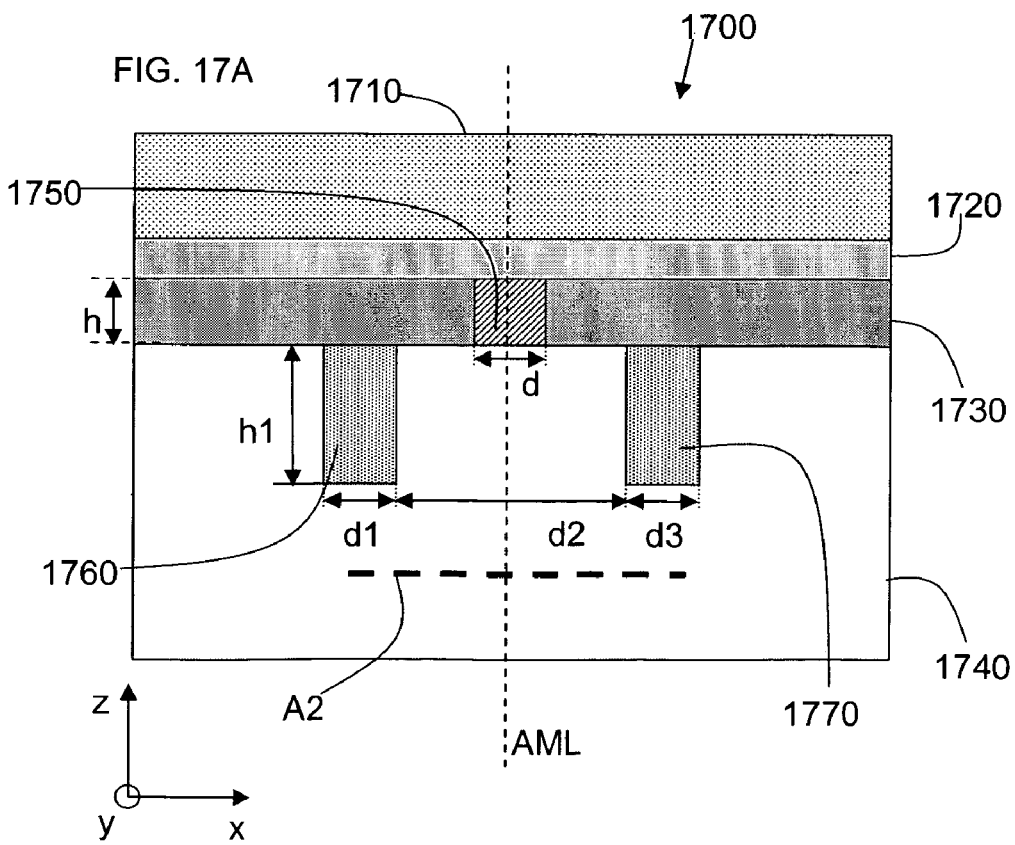

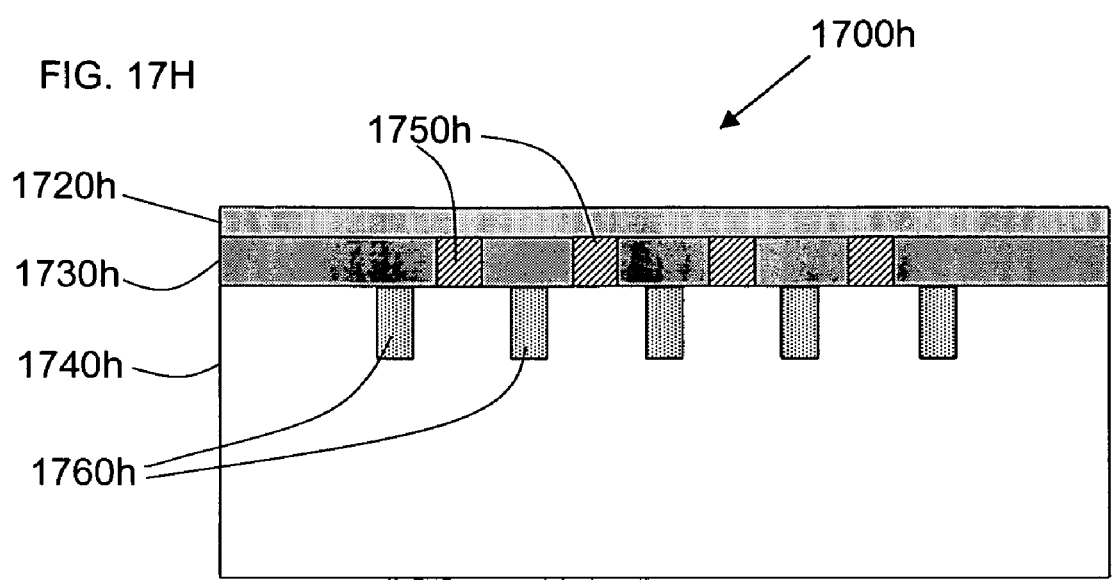

APPARATUS AND METHOD FOR IMPROVING DETECTED RESOLUTION AND/OR INTENSITY OF A SAMPLED IMAGE

FIELD OF THE INVENTION

The present invention relates to a method/apparatus for improving detected resolution and/or intensity of a sampled image. More particularly, though not exclusively, the present invention is related to varying aperture properties to improve detection resolution and/or detection intensity of an image of a reticle pattern.

BACKGROUND OF THE INVENTION

FIG. 1 illustrates a conventional exposure apparatus 100 used for optical lithography. An illumination system 110 (e.g., ArF laser), illuminates (exposes) 120 a pattern 135 in a reticle 130. The patterned light (image light) 140, carrying an image 175 of the pattern 135, is projected 160 via a projection lens 150 onto a wafer 170, which has a photoresist layer (not shown) spin-coated thereon. The image light 160 exposes the photoresist, which is then developed (non exposed photoresist removed for negative-type photoresist and exposed photoresist removed for positive-type photoresist) and etched (e.g., via plasma etching) to form structures in the wafer 170. The accuracy of the transfer of the pattern 135 of the reticle 130 into the wafer 170 depends on several quality issues. For example, aberrations that are residual in the projection lens can result in an image 175 that does not accurately represent the pattern 135 on the reticle. This is one reason that detectors are used to sample the image light 160 incident on a wafer 170.

The resolution R of the conventional system illustrated in FIG. 1 is determined by it's projection lens 150 numerical aperture (NA) and the illumination (exposure) wavelength (?). The relationship can be expressed as:

$$R = (k1\ ?)/NA \qquad (1)$$

where k1 is a process dependent factor (e.g., between 0.3-0.5). For example, an ArF laser is used as the illumination system (?=193 nm) and an NA of over 1.0 can be obtained using an immersion system. For an immersion system the space between the projection lens 150 and the wafer 170 is filled with fluid. The fluid can be transparent to the illumination wavelength and have an index of refraction "n" greater than 1 (e.g., purified water n=1.44). Note that when the term fluid is referred to herein it can include liquids (e.g., water) and gases (e.g., air at various pressures).

One method of conventional detection to acquire the image accuracy is to expose the photoresist, develop the photoresist, and view it under a scanning electron microscope (SEM). However several photoresist properties in addition to the desire to sample the image directly have led to the development of sampling detection arrangements.

FIG. 2A illustrates a conventional one slit (aperture) sampling detection arrangement 200a (detector aperture) used to sample the image light to acquire a measure of the accuracy of the image 210a. The image light is incident on the detector aperture whereby a portion of the light is shielded from passage through the detector aperture by a shield layer 230a. The shield layer 230a lies on a support substrate 240a, and has an opening (aperture) 220a through which light of a chosen wavelength can pass. The portion of image light 250a which passes through the aperture is detected by a detector 260a. To sample the entire image the detector aperture is moved 290 along with the detector 260a.

FIG. 2B illustrates a conventional multi slit 220b (multi-aperture) image sampling detection arrangement 200b (detector aperture). This arrangement is similar to the single aperture arrangement but with multiple slits to sample a periodic image. Both arrangements can be moved to sample the entire image. Since the image is periodic, each aperture practically captures the same image portion. The arrangement in FIG. 2B allows more light, compared with the single slit arrangement in FIG. 2A, to be detected by the detector. Again the image 210b is sampled by a detector 260b that detects the portion of the image light 250b passing through the detector aperture 200b, i.e. the portion passing through the multi-apertures 220b. The other portions not being transmitted through the detector aperture 200b are shielded by the shield layer 230b, which is supported by the support substrate 240b.

In several conventional arrangements the aperture width (e.g., a slit width) is smaller than the image light wavelength so that image features can be detected. U.S. Pat. No. 5,631,731 discusses a single slit aperture arrangement and a multi-slit arrangement. Note that the term aperture is used to denote an opening, a slit, a hole, and any other type of region that allows a particular frequency of light to pass while other neighboring regions do not. Since the aperture width tends to be smaller than the wavelength of the image light, diffraction can occur upon exiting the aperture(s), adding to image detection errors at the detector (e.g., reduced contrast, reduced intensity). Reduced contrast can occur when different polarizations of the image light, each having different levels of contrast, are transmitted differently through the detector aperture. Reduced intensity can occur when only a portion of the diffracted light reaches the detector.

FIG. 3A illustrates the diffraction 370 of image light 330 passing through a narrow aperture 320 of a detection aperture 300. The aperture width is "d" and is assumed to be less than the image light wavelength ? 340. The thickness of the shield layer 310 is W1, and can vary depending upon the extinction characteristics of the material used for the shield layer 310. The image light 330 can have two polarizations, a Transverse Electric (TE) polarization 360a and a Transverse magnetic polarization (TM) 360b. The electric field of the TE mode 360a is aligned with a chosen direction (e.g. along the long part of a slit), while the electric field of the TM mode 360b is aligned substantially perpendicular to the TE mode's field alignment. In a conventional exposure system (FIG. 1) the illumination beam is not polarized. In such a case, the image 175 is given as a superposition of the TE and TM polarization components (roughly 50% each). Thus, if the slit transmittance is different between the TE and TM polarizations, the image detected through the aperture will be different from the image that would have been created in photoresist without the aperture. This can lead to an accuracy problem in the measurement.

As discussed above the different polarizations TM and TE can have different transmittance properties through an aperture. FIG. 3B illustrates the relative transmittance of TE and TM polarized image light through the narrow aperture 320 of the detector aperture 300 of FIG. 3A. The plots are based upon a simulation (solving Maxwell's Equations using Finite Difference Time Domain (FDTD) method) where the conditions assumed are:

that the shielding material is Cr, where the optical properties are n=0.841, and k=1.647;

where the illumination light has a wavelength of ?=193 nm (e.g., ArF laser);

where the thickness of the shielding later is about 95 nm; and where the aperture is a slit and is varied from 15 nm to 235 nm.

As is illustrated in FIG. 3B the transmittance for the TE and TM modes are different for various slit widths, and match at a slit width of about 60 nm. However to determine features in the image light it is often useful to have a slit width smaller than 60 nm, for example 45 nm. At 45 nm though the TM transmittance is higher than the TE transmittance. Notice that at 45 nm the transmittance level of both modes have decreased.

To illustrate reduced intensity due to diffractive effects on the transmitted image light, a detector is moved to two positions A1 and A2 (FIG. 3A) and the image light measured and plotted in FIGS. 3C and 3D respectively.

FIG. 3C illustrates the Poynting vector intensity as a function of spatial dimension at an observing position A1 for the simulation conditions. Position A1 is next to the aperture 320 while position A2 is offset 1.5 microns from the aperture exit. FIG. 3C illustrates the localized intensity about the Aperture Middle Line (AML) with no offset distance. However, often the detector can not be placed at the aperture exit. Instead the sensor of the detector is often set within the detector so that there is a resultant offset distance.

FIG. 3D illustrates the Poynting vector intensity as a function of spatial dimension at an observing position A2, at an offset distance of 1.5 microns from the aperture exit. FIG. 3D illustrates the dispersed and reduced nature of the intensity about the AML at an offset distance. Thus the diffractive nature of the aperture can result in decreased intensity at the detector and contrast reduction, and a lower signal to noise ratio (i.e., SN ratio).

In addition to diffraction's reduction of the detected image intensity, the various transmittances of the TE and TM mode can result in reduced accuracy in the measurement. For example FIG. 4A illustrates the image 420*a* from TE polarized image light 410*a*.

FIG. 4B illustrates the image 420*b* from TM polarized image light 410*b*. When the illumination beam is not polarized, the actual image is represented as a superposition (or as the average) of the two image components. Thus, when more TM mode light is transmitted through an aperture the detected image will be different from the image created on the wafer. Thus, conventional detector apertures can suffer from various levels of diffractive effects and accuracy issues.

SUMMARY OF THE INVENTION

At least one exemplary embodiment is directed to a detection aperture that substantially matches the TE and TM polarizations by adjusting the aperture refractive index, improving the detected resolution and/or intensity of the sampled image.

At least one exemplary embodiment is directed to a detection aperture that substantially increases the relative magnitude of the transmittance of the TE polarization compared to the TM polarization by adjusting the aperture refractive index, improving the detected resolution and/or intensity of the sampled image.

At least one exemplary embodiment is directed to a detection aperture that substantially reduces the effect of diffraction of light through the aperture by adjusting the relative index of refraction between the aperture and a subsequent layer or by the addition of scattering structures, improving the detected resolution and/or intensity of the sampled image.

At least one exemplary embodiment is directed to methods of fabrication of detection apertures of exemplary embodiments.

Further areas of applicability of exemplary embodiments of the present invention will become apparent from the detailed description provided hereinafter. It should be understood that the detailed description and specific examples, while indicating exemplary embodiments of the invention, are intended for purposes of illustration only and are not intended to limited the scope of the invention.

BRIEF DESCRIPTION OF THE DRAWINGS

Exemplary embodiments of present invention will become more fully understood from the detailed description and the accompanying drawings.

FIG. 1 illustrates a conventional exposure apparatus used for optical lithography.

FIG. 4A illustrates the image contrast of TE polarized image light.

FIG. 4B illustrates the image contrast of TM polarized image light.

FIG. 6B illustrates an example of a detection aperture, in accordance with at least one exemplary embodiment, fabricated in accordance with the method illustrated in FIG. 6A.

FIGS. 6C-6F illustrate several steps of the method illustrated in FIG. 6A.

FIG. 13A illustrates an example of a detection aperture in accordance with the second exemplary embodiment, using shield layer thickness of 80 nm.

FIG. 13B illustrates the relative transmittance of TE and TM polarizations as a function of aperture filler material for the example illustrated in FIG. 13A.

FIG. 13C illustrates an example of a detection aperture in accordance with the second exemplary embodiment, using a shield layer thickness of 50 nm.

FIG. 13D illustrates the relative transmittance of TE and TM polarizations as a function of material for the example illustrated in FIG. 13C.

FIG. 16 illustrates an example of a detection aperture in accordance with at least one exemplary embodiment, having multiple apertures.

FIG. 17A illustrates an example of a detection aperture in accordance with a third exemplary embodiment.

FIGS. 17C through 17H illustrate further examples of detection apertures in accordance with the third exemplary embodiment.

DETAILED DESCRIPTION OF EXEMPLARY EMBODIMENTS OF THE PRESENT INVENTION

Figure 2A:
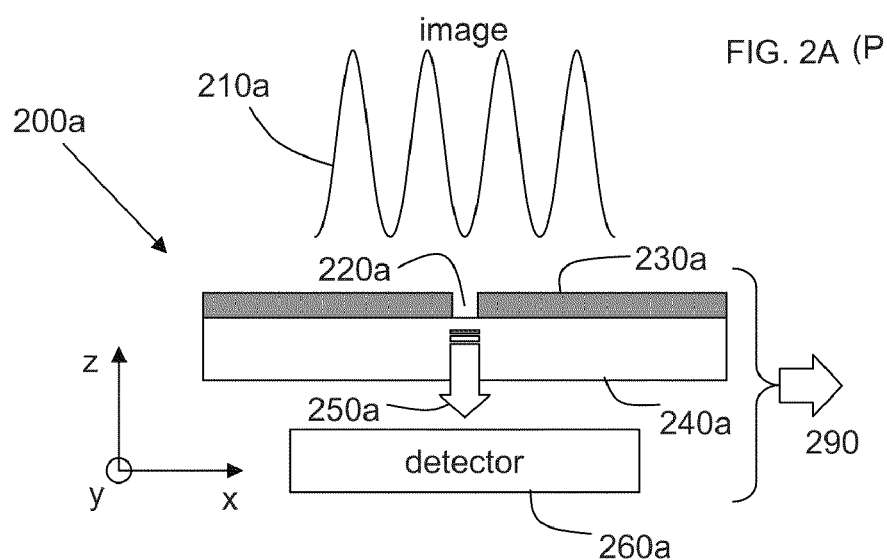
FIG. 2A illustrates a conventional one slit image sampling detection arrangement.
Figure 2B:
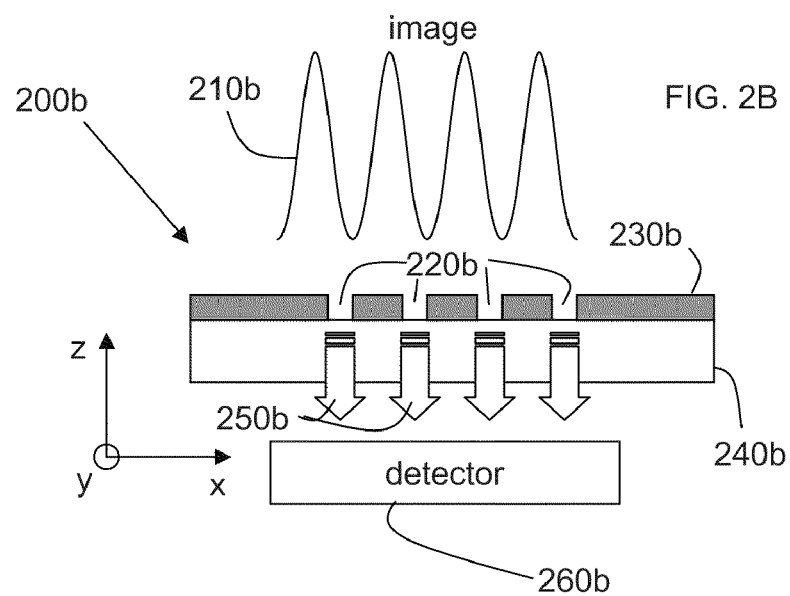
FIG. 2B illustrates a conventional multi slit image sampling detection arrangement.

The following description of exemplary embodiment(s) is merely illustrative in nature and is in no way intended to limit the invention, its application, or uses. Exemplary embodiments can be used with any image sampling or detection system and are not limited to those discussed in the illustrative examples herein.

Processes, techniques, apparatus, and materials as known by one of ordinary skill in the art may not be discussed in detail but are intended to be part of the enabling description where appropriate. For example semiconductor etching materials and procedures may not be discussed in detail (e.g., using positive or negative photoresists), however one of ordinary skill would be able, without undo experimentation, to use such materials and procedures, given the enabling disclosure herein, to construct detection aperture devices in accordance with exemplary embodiments. Such procedures and materials are intended to fall within the scope exemplary embodiments.

Also note that exemplary embodiments can also be applied to any imaging apparatus that samples an image through an aperture, (e.g., a microscope) and thus, are not limited to the example uses described herein.

Notice that similar reference numerals and letters refer to similar items in the following figures, and thus once an item is defined in one figure, it may not be discussed or further defined in the following figures.

Summary of Exemplary Embodiments

Three exemplary embodiments are discussed herein with associated examples. However these exemplary embodiments are not meant to be limitative of the number of exemplary embodiments but instead are included for illustrative purposes.

The first exemplary embodiment is directed to a detection aperture that substantially matches the TE and TM polarizations by adjusting the aperture refractive index, improving the detected resolution and/or intensity of the sampled image.

The second exemplary embodiment is directed to a detection aperture that substantially increases the relative magnitude of the transmittance of the TE polarization compared to the TM polarization by adjusting the aperture refractive index, improving the detected resolution and/or intensity of the sampled image.

The third exemplary embodiment is directed to a detection aperture that substantially reduces the effect of diffraction of light through the aperture by adjusting the relative index of refraction between the aperture and a subsequent layer or by providing scattering structures, improving the detected resolution and/or intensity of the sampled image.

First Exemplary Embodiment

The first exemplary embodiment substantially matches the transmittance between the TE and TM polarizations, by properly adjusting the aperture refractive index between 1 (e.g., air or vacuum) and that of a substrate (e.g., SiO2, n=1.56). FIGS. 5A, 6B, 7B, and 8 illustrate four non-limiting examples in accordance with the first exemplary embodiment. To adjust the aperture effective refractive index, a material can be added in the aperture, for example SiO2, MgF2, LiF, and other materials to adjust the index of refraction as known by one of ordinary skill in the relevant art and equivalents.

Figure 5A:
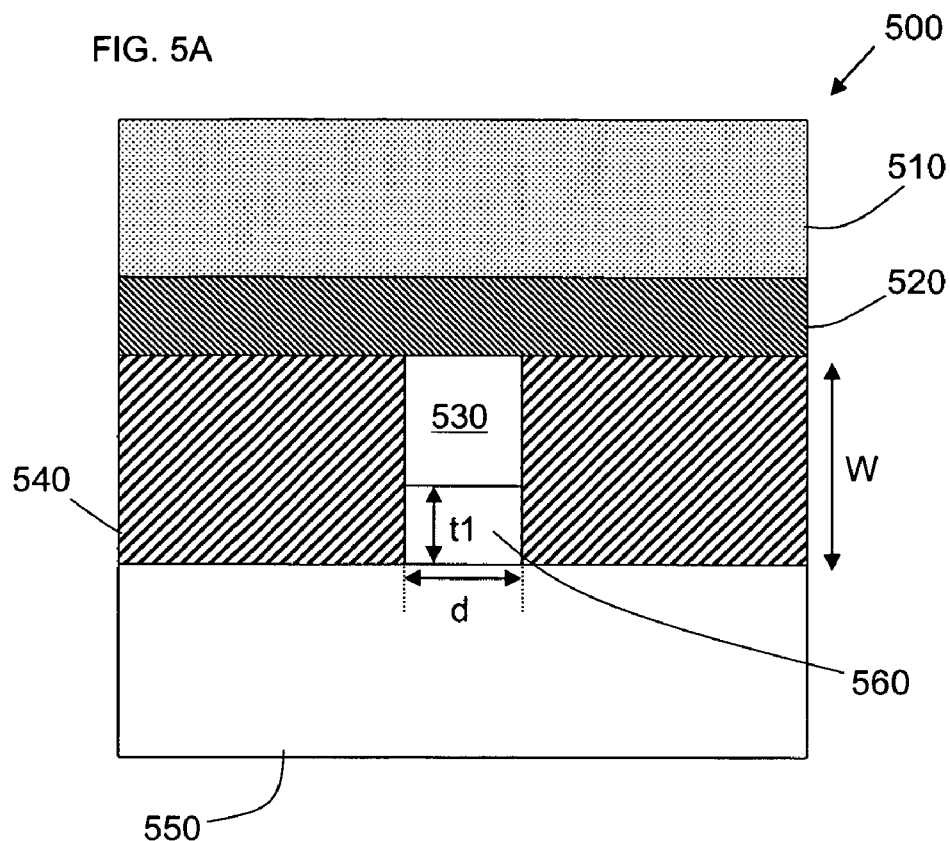
FIG. 5A illustrates an example of a detection aperture in accordance with a first exemplary embodiment.

A first example of a detection aperture 500, in accordance with the first exemplary embodiment is illustrated in FIG. 5A. A shield layer 540 has an aperture with a first aperture material 530 and a second aperture material 560 inserted. The second aperture material has a thickness of "t1" and a width of "d." The shield layer 540 can be covered by a cover layer 520 (e.g., SiO2) that is substantially transparent to the wavelength of the image light and can hold in the aperture materials or prevent other materials from entering the aperture. The cover layer 520 is exposed on the opposite side to the aperture to an adjacent medium 510 that can vary depending upon the device or its usage (e.g., purified water, air, vacuum), and the shield layer can be supported by a support layer 550 that is operatively connected to the shield layer 540 on the side opposite the cover layer 520. Setting the aperture width (e.g., a slit width) to a desired value and varying the thickness t1 can result in varying the transmittance of TE and TM modes through the aperture.

Figure 5B:
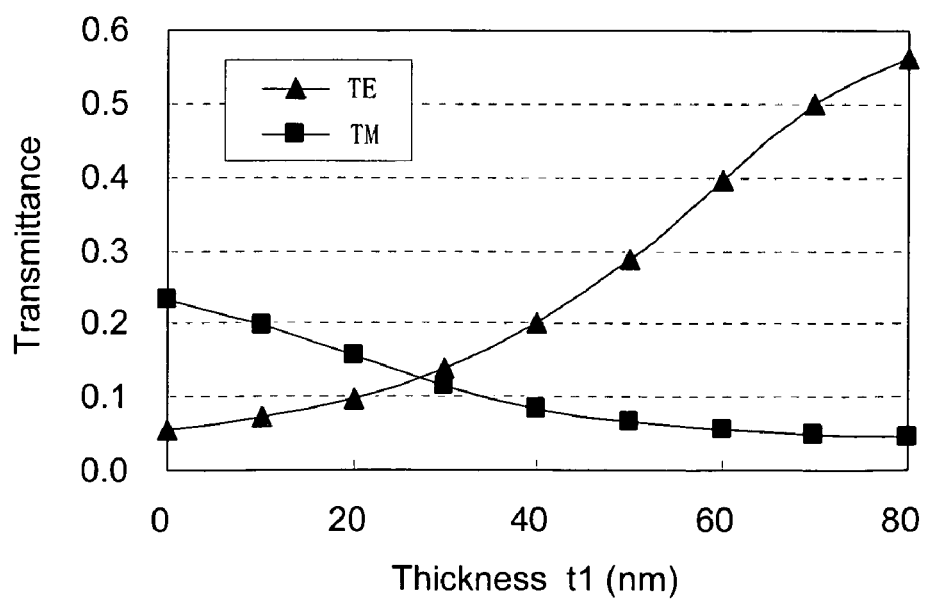
FIG. 5B illustrates the relative transmittance of TE and TM polarized image light through the detection aperture of the example illustrated in FIG. 5A.
Figure 6A:
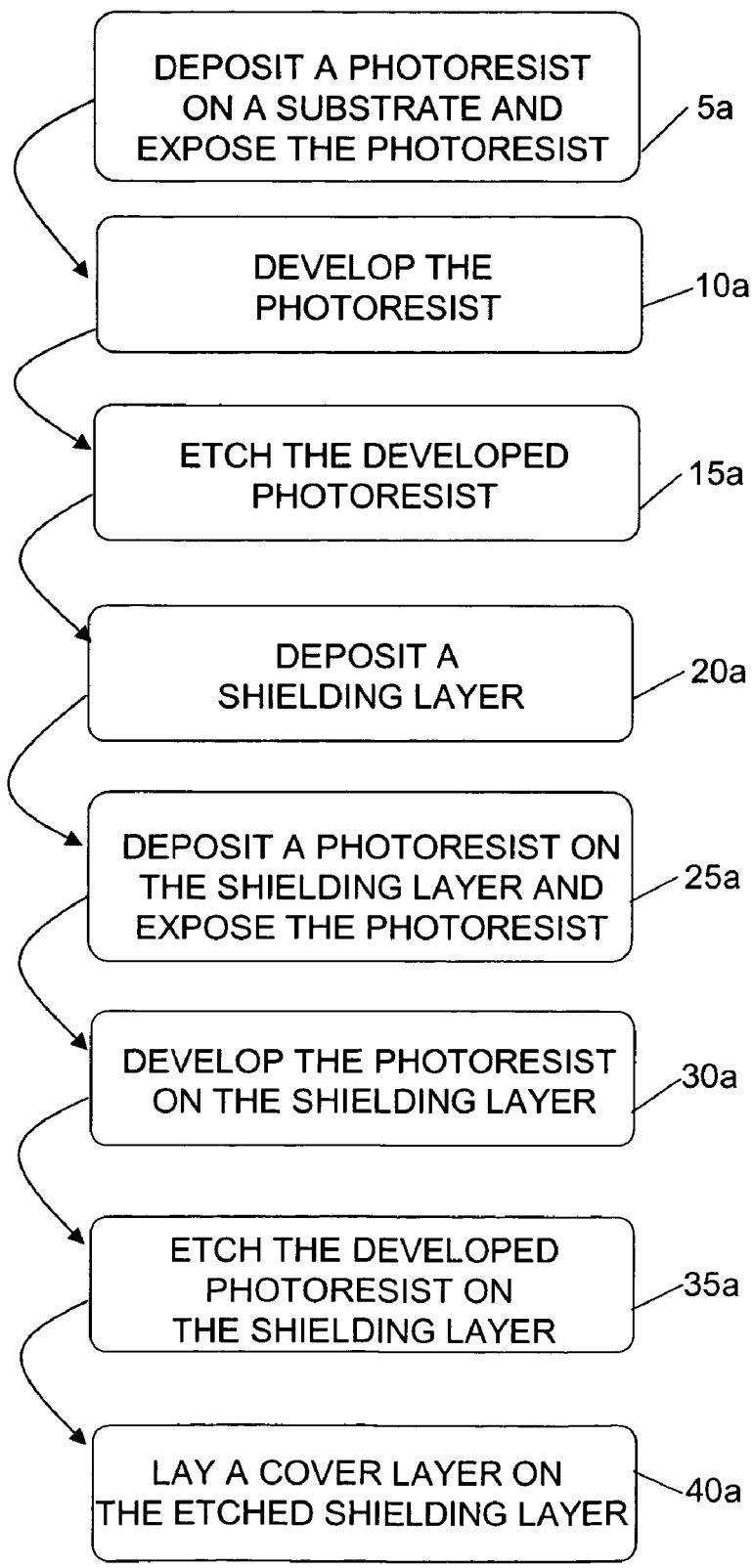
FIG. 6A illustrates a first example of a method of fabricating a detection aperture in accordance with at least one exemplary embodiment.
Figure 7A:
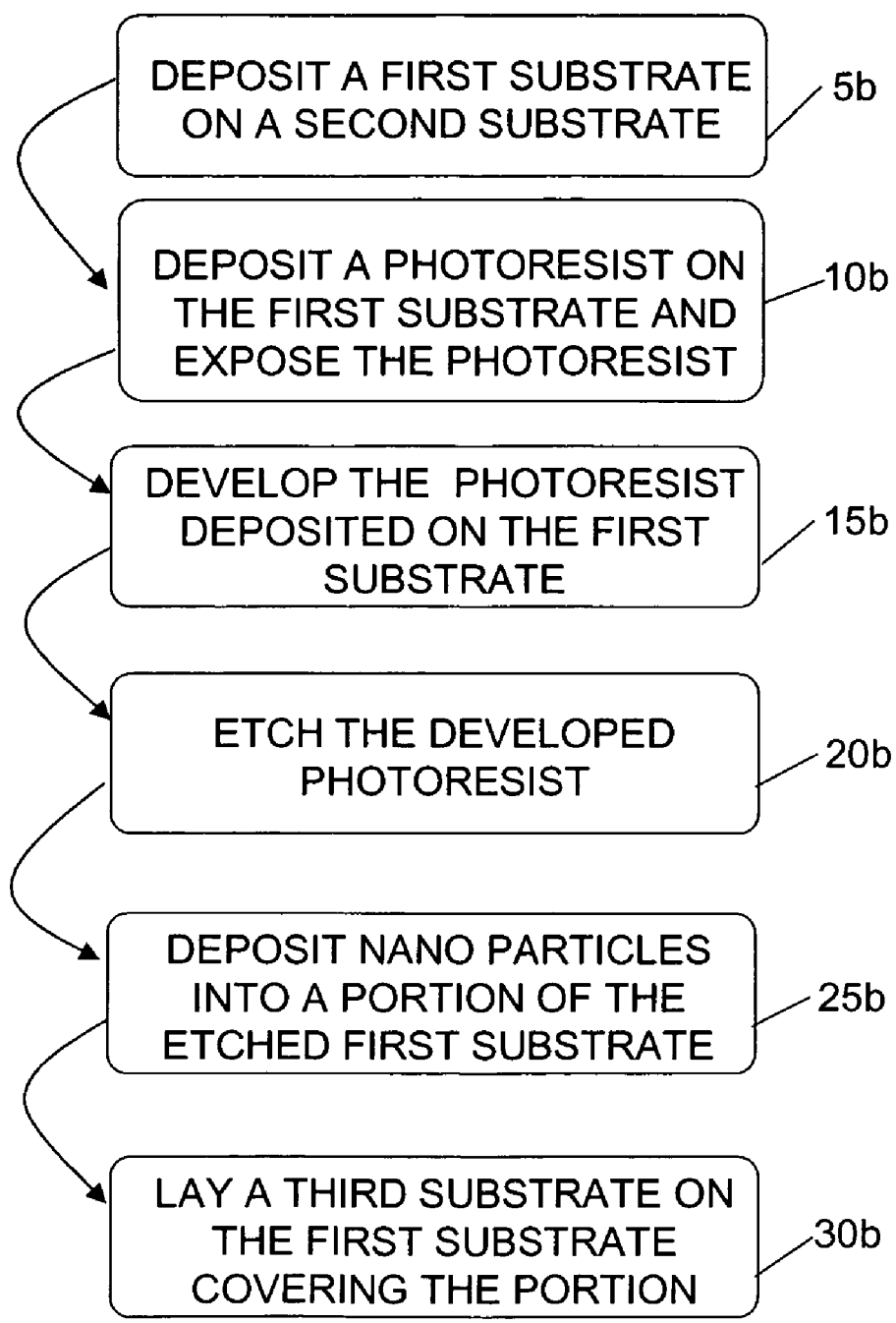
FIG. 7A illustrates a second example of a method of fabricating a detection aperture in accordance with at least one exemplary embodiment.
Figure 7B:
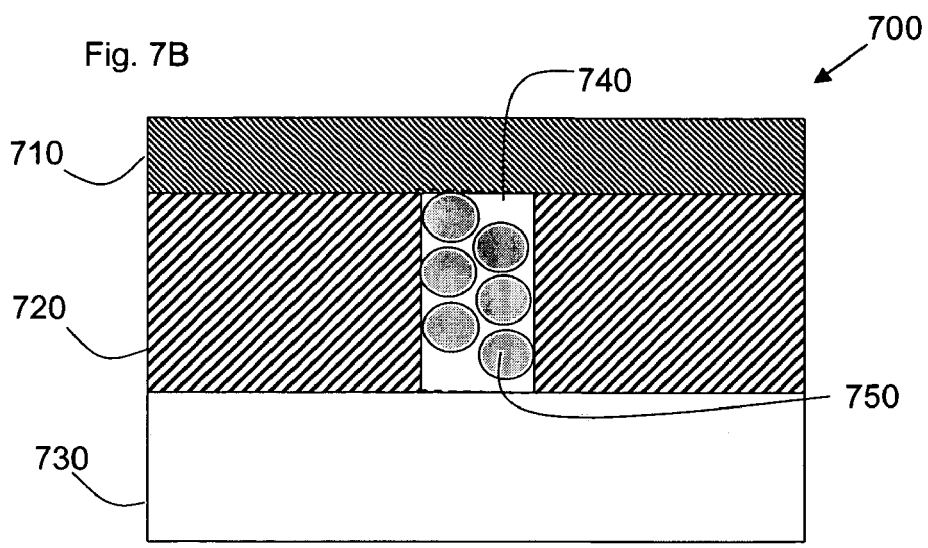
FIG. 7B illustrates an example of a detection aperture, in accordance with at least one exemplary embodiment, fabricated in accordance with the method illustrated in FIG. 7A.
Figure 7C:
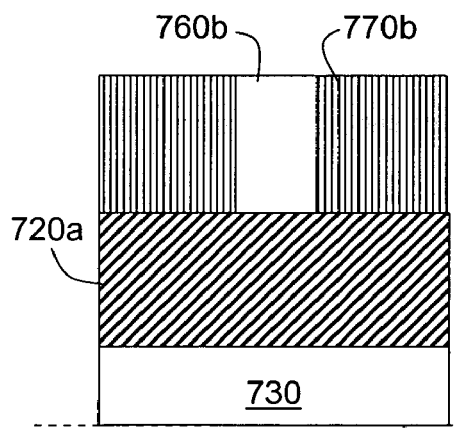
FIGS. 7C-7F illustrate several steps of the method illustrated in FIG. 7A.
Figure 7D:
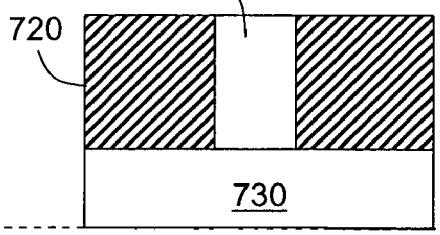
Figure 7E:
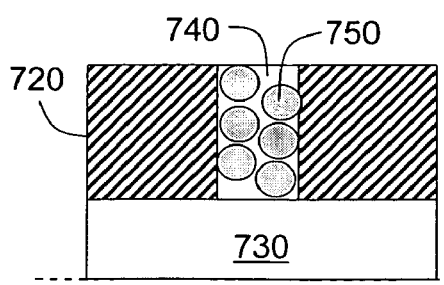
Figure 7F:
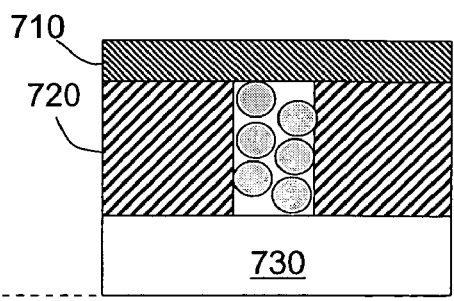

For example FIG. 5B illustrates the relative transmittance of TE and TM polarized image light through the detection aperture of the first example of the first exemplary embodiment illustrated in FIG. 5A for particular simulation conditions. The simulation conditions are:

for an adjacent medium 510 of water (n=1.44, k=0);

where the light shield layer 540 is made of Cr, with a thickness (W) of 80 nm, where 80 nm has been chosen so that the transmittance of light through the shield layer is less than 0.001;

where support layer 550 is SiO2 (n=1.56, k=0);

where the cover layer 520 is also SiO2, and prohibits water from the adjacent medium 510 from entering the aperture;

the aperture is a slit with a width (d) of 45 nm, where the theoretical image resolution is 22.5 nm; and where the thickness (t1) is varied from 0 to 80 nm, where the material for the second aperture medium 560 is SiO2 and the material of the first aperture medium 530 is air. Note that these values are for illustrative purposes only and other various dimensional values and materials can be used within the scope of the first exemplary embodiment.

FIG. 5B illustrates the simulation results. A thickness (t1) value of 80 nm symbolizes that the aperture is completely filled with the second aperture medium. Notice in this case that the TE mode's transmittance is higher than the TM mode's transmittance for certain thicknesses t1. Additionally note that with a thickness (t1) of about 28 nm the transmittance of the TE and TM modes is substantially equal. Thus, varying the thickness (t1) varies the relative transmittance and similar procedures can be used to substantially match the transmittance of the TE and TM modes through the aperture to the detector or to emphasize particular modes (e.g., the second exemplary embodiment). To fabricate a detector aperture in accordance with the first exemplary embodiment, processes and techniques involved in semiconductor etching can be used.

FIGS. 6A-6F illustrates an example of a detector aperture 600 and a method of fabricating the detection aperture in accordance with at least one exemplary embodiment. A photoresist (e.g., positive or negative photoresist) is deposited (5a) (e.g., 660a) on a substrate 630a and exposed (5a) (670a) using illumination and a reticle as described generally above in the background section. The exposed photoresist is then developed (10a) and etched (15a) to form a structure 650 in the original substrate 630a, forming the support layer 630. A shield layer 620 is deposited (20a) on the support layer 630 and the structure 650. Then a photoresist is deposited (25a) (e.g., 660b) on the shield layer 620 and exposed (670b) using illumination and a reticle as described generally above in the background section. The exposed photoresist (670b) is developed (30a) and etched (35a) to form a recess comprising the remaining portion of an aperture, which can be filled with a medium, the first aperture medium 640, (e.g., air). Finally a cover layer 610 is laid (40a) on the shield layer 620.

FIGS. 7A-7F illustrates an example of a detector aperture 700 and a method of fabricating the detection aperture in accordance with the first exemplary embodiment. A first substrate 720a is deposited (5b) on a second substrate 730, where the second substrate 730 is a support layer and the first substrate 720 is a shield layer. A photoresist is deposited (10b) (e.g., 760b) on the first substrate 720 and exposed (10b) (770b) using illumination and a reticle as described generally above in the background section. The photoresist is then developed (15b). The developed photoresist is etched (20b) to form a recess 740, where the recess forms an aperture. Nanoparticles (e.g., nanospheres, columns, other nanometer or less sized particles of regular or irregular shape) are deposited (25b) into a portion of the recess 740 forming the second aperture medium 750. The amount and material composition of the nanoparticles can be varied to vary the aperture effective index of refraction and the relative transmittance between the TE and TM modes. Finally a cover layer 710 is laid (30b) on the shield layer 720 to cover the first aperture medium (e.g., air) placed in the recess 740, and the second aperture medium 750 (e.g., nanoparticles). Many different materials can be used for the nanoparticles, for example SiO2 and MgF2. Additionally when referring to nanoparticles we are also referring to nano-sized absence of material (e.g., columns of air, bubbles).

Figure 8:
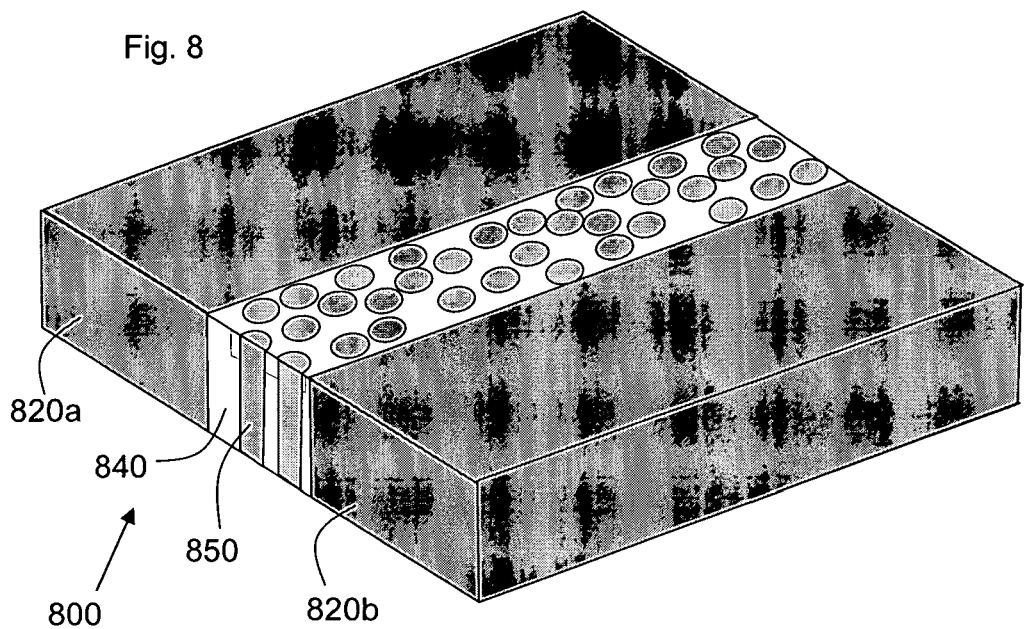
FIG. 8 illustrates an example of a detection aperture in accordance with at least one exemplary embodiment.

For example a fourth example of a detection aperture 800, comprising a porous aperture (nano-sized columns), in accordance with the first exemplary embodiment is illustrated in FIG. 8. The second aperture medium 850 can be composed of various shapes for example gas or solid columns that extend throughout the thickness of the aperture creating a porous structure. Here the term porous is meant to refer not only to gaseous columns in a solid material but also to a material inhomogeneity in the aperture. The columns can be etched in the first aperture medium 840 using processes already discussed and as known by one of ordinary skill in the relevant art. The shield layer can be comprised of a left portion 820a and a right portion 820b, each of which can have different properties.

In summary a detection aperture in accordance with first exemplary embodiment can include a shield layer; and an aperture, wherein the aperture is placed in the shield layer, and where the aperture has a first portion filled with a medium (e.g. a first and/or second aperture medium), where the medium can change the effective index of refraction within the aperture, and where the effective index of refraction facilitates the passage of light polarized in both the TM and TE modes to pass through the aperture with about the same transmittance level. Note that various materials can be used for the shield layer for example Cr, Si, Mo, Ta, W, Rh, MoN, NbN, other materials as known by one of ordinary skill in the relevant arts and equivalents. Additionally the shield layer can vary in thickness (e.g., between 10-300 nm, 25 nm-100 nm, and other ranges as determined by design and/or understood by one of ordinary skill in the relevant arts) and the material chosen for the shield layer can be chosen so as to allow more TE or TM mode light through the shield layer.

A detection aperture according to the first exemplary embodiment can further include a cover layer, a support layer, various materials for the medium in the aperture, and can be exposed to several types of adjacent mediums. For example the medium in the aperture can change the effective index of refraction of the aperture to higher than 1 and/or lower than the refractive index of the support layer and can be made of various materials (e.g., SiO2, LiF, MgF2, other materials as known by one of ordinary skill in the relevant arts and equivalents). Additionally, the cover layer can be exposed (on the opposite side of the aperture) to various materials, for example fluid (e.g., air or water) and vacuum. Note that water is provided as a non-limiting example of a possible adjacent material. Another similar example would be a transparent material (e.g., fluid or solid) that has higher index of refraction than water.

Additionally, a detection aperture according to the first exemplary embodiment is not limited to a single aperture (e.g. a single slit). Multiple apertures (e.g. multiple slits) can be used with similar arrangements and materials. For example a detection aperture in accordance with the first exemplary embodiment can include a plurality of apertures where the plurality of apertures has a common shield layer and where the apertures of the plurality of apertures are spaced in the shield layer.

Second Exemplary Embodiment

The second exemplary embodiment increases the relative transmittance of the TE polarization compared to the transmittance of the TM polarization, by properly adjusting the effective aperture refractive index. In at least one exemplary embodiment the effective aperture refractive index can be changed in a range being equal to or higher than that of the substrate. This embodiment can also be used in an exposure system in which the illumination beam is linearly polarized so that the images are created mainly by the TE polarization component. The same illustrative examples provided for the first exemplary embodiment are applicable for the second exemplary embodiment, where the material inserted into the aperture to adjust the aperture index of refraction can be different than that used for the first exemplary embodiment, so that the relative intensity of transmitted TE mode light compared to the intensity of transmitted TM mode light is increased. When choosing an insertion material, a rule of thumb that can be useful is that the higher the refractive index the higher the TE transmittance. For example AlN can be used for the material inserted into at least a portion of the aperture to adjust the refractive index of the aperture (e.g., for incident image light of 193 nm wavelength). Alternatively for ease of fabrication SiO2 can be used even though the transmittance is lower than the case of AlN for the 193 nm wavelength incident image light. The material that can be inserted into the aperture is not limited to the ones mentioned and can be various materials to adjust the aperture index of refraction for example, Al2O3, Cr2O3, HfO2, Si3N4, and other material to adjust the index of refraction as known by one of ordinary skill in the relevant arts and equivalents. Note that the thickness of a material can be varied along with the material itself.

In addition to varying the material inserted into the aperture to vary the effective index of refraction for the aperture, the material that the shield layer is made of can be chosen to minimize transmission levels through the shield layer for particular TE or TM modes. Additionally the thickness of the shield layer 540 will determine the maximum thickness (t1) that the second aperture medium 560 can have. The thickness of the shielding material depends on a chosen transmission value (e.g., less than or equal to a transmittance level of 0.001) and the extinction coefficient (k) of the material.

Figure 9:
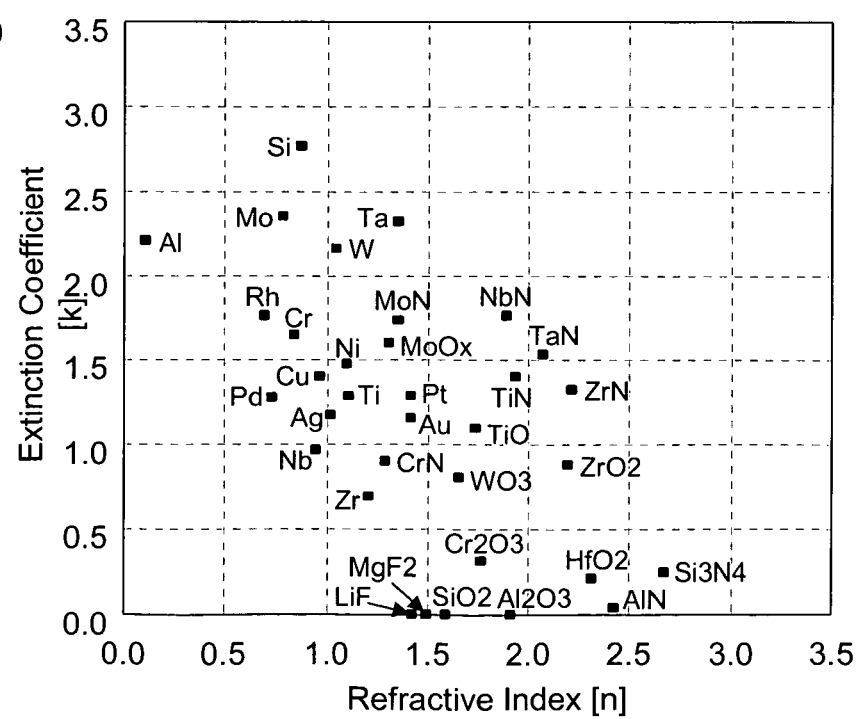
FIG. 9 illustrates a plot of the extinction coefficient versus refractive index for several materials.
Figure 10:
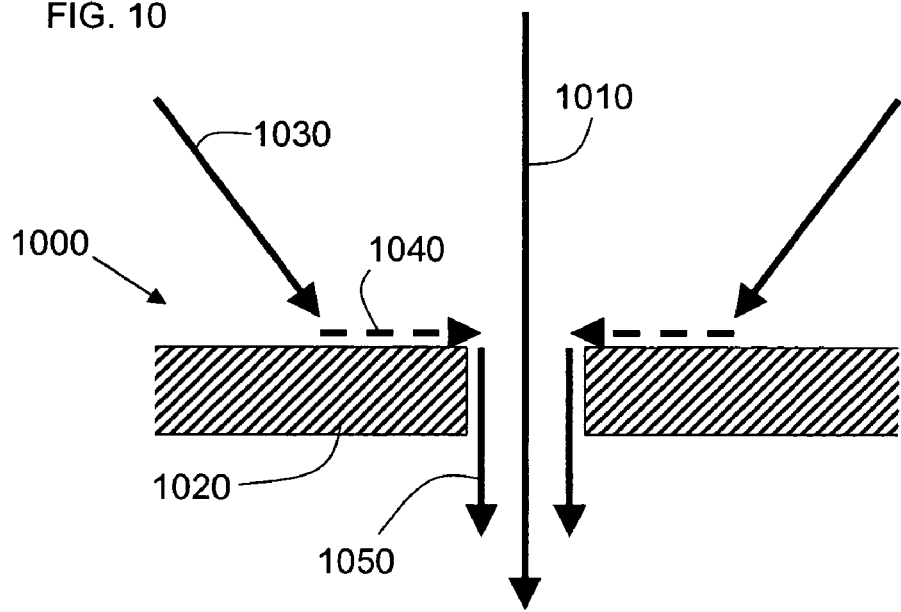
FIG. 10 illustrates the formation of surface plasmon waves interfering with the image light passing through an aperture.
Figure 11:
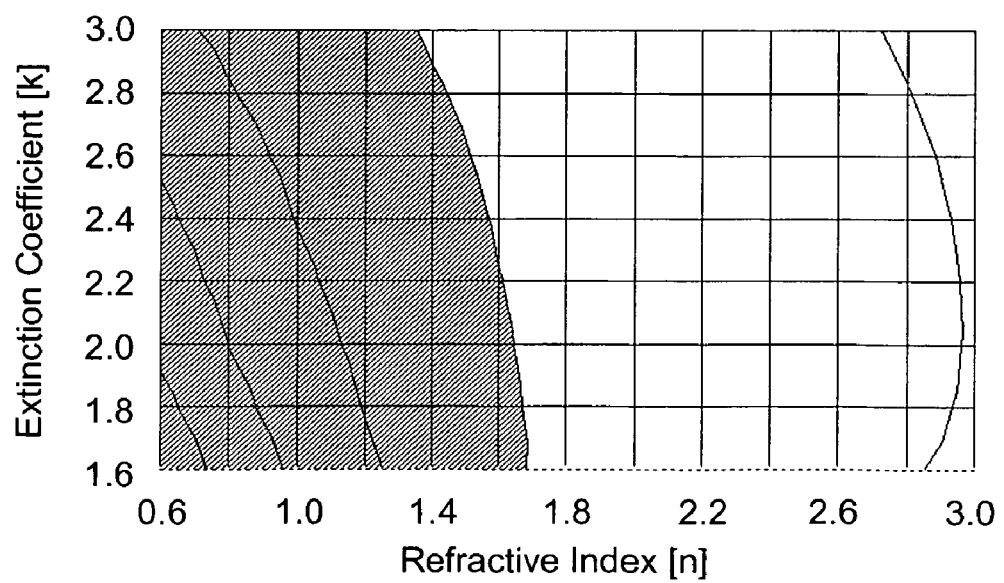
FIG. 11 illustrates a plot showing the region of the extinction coefficients and refractive indexes that facilitate a material being used as a shield layer for a chosen thickness criteria.

FIG. 9 illustrates a plot of the extinction coefficient (k) versus refractive index (n) for several materials for light at 193 nm wavelength. Note that various materials can be used depending upon the desired refractive index n and extinction coefficient k. For example the thickness (W) of a shield layer 540 can decrease as the extinction coefficient increases. Thus the thickness using Si, Mo, Ta, W, and Al, will be less than if ZiO2 if used. If the material is metallic (i.e., low n values and high k values) additional considerations arise. The interface between a metal and an insulator can form surface plasmon waves which can then interfere with the incident light. The surface plasmon waves can carry impinging light energy (e.g., on normally light shielding regions) through the aperture on the aperture wall surface, which can be emitted upon passing through the aperture. This plasmon emitted light can also be detrimental to the resolution and/or intensity of the sampled image. FIG. 10 illustrates the formation of surface plasmon waves 1040 on a metallic shield layer 1020 of a detection aperture 1000, via stimulation of incident light 1030, where the plasmon waves carrying energy 1050 through the aperture interfering with the image light 1010 passing through the aperture. In at least one exemplary embodiment a range of n and k for the shield layer can be chosen to help reduce the effects on resolution and intensity. For example FIG. 11 illustrates a plot showing the region of the extinction coefficients and refractive indexes that facilitate a material being used as a shield layer (i.e., material in the shaded region) for a range of optical properties which for this example are:

(2) n>=0.6 and an extinction coefficient range of
(3) k>=1.6.

From the values shown in the shaded region, we can see that various materials can be used for the ranges chosen, for example Si, Mo, Ta, W, Rh, Cr, MoN, NbN, amongst others as known by one ordinary skill in the relevant arts and equivalents.

Figure 12A:
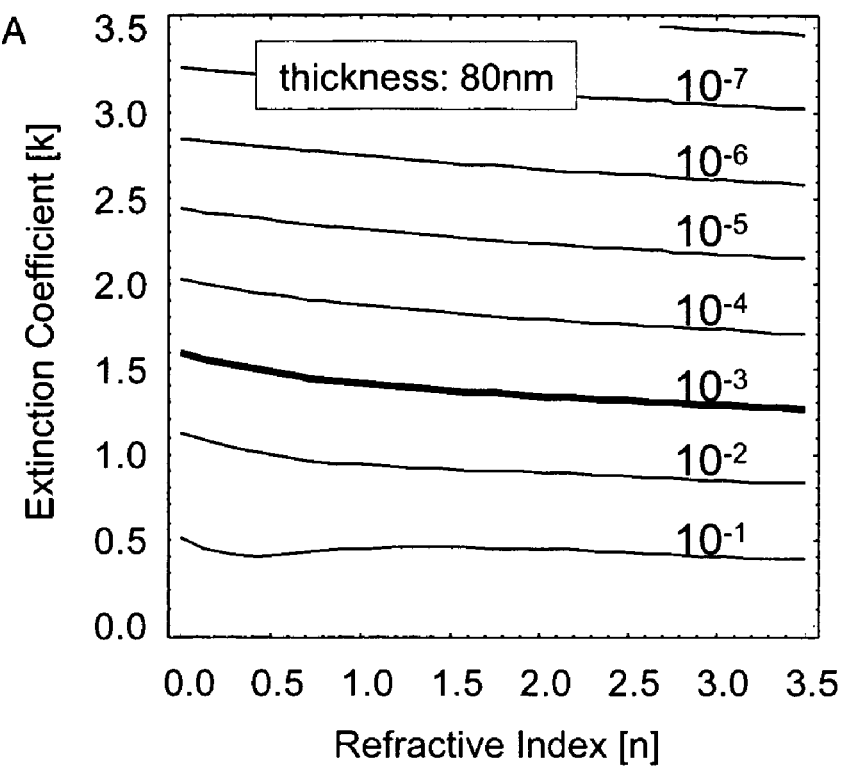
FIG. 12A illustrates a plot of the extinction coefficients versus refractive index for the example of a shield layer thickness of 80 nanometers (nm) for various materials, where the roughly horizontal plot lines are transmittance levels.

FIG. 12A illustrates a plot of the extinction coefficients versus refractive index for a shield layer thickness of 80 nanometers (nm) for various materials, where the roughly horizontal plot lines are transmittance levels. The bold line represents an arbitrary design criterion of 0.001 transmission level through the shield layer. The materials with extinction coefficients above the solid line provide transmission levels less than or equal to the selected criteria of 0.001 transmission level. For example MoN, NbN, TaN, Si, Al, Rh, Cr, W, Ta and Mo, amongst other materials as known by one of ordinary skill in the relevant arts and equivalents would provide extinction coefficient values above the approximately 1.5 needed for a shield layer thickness of 80 nm.

Figure 12B:
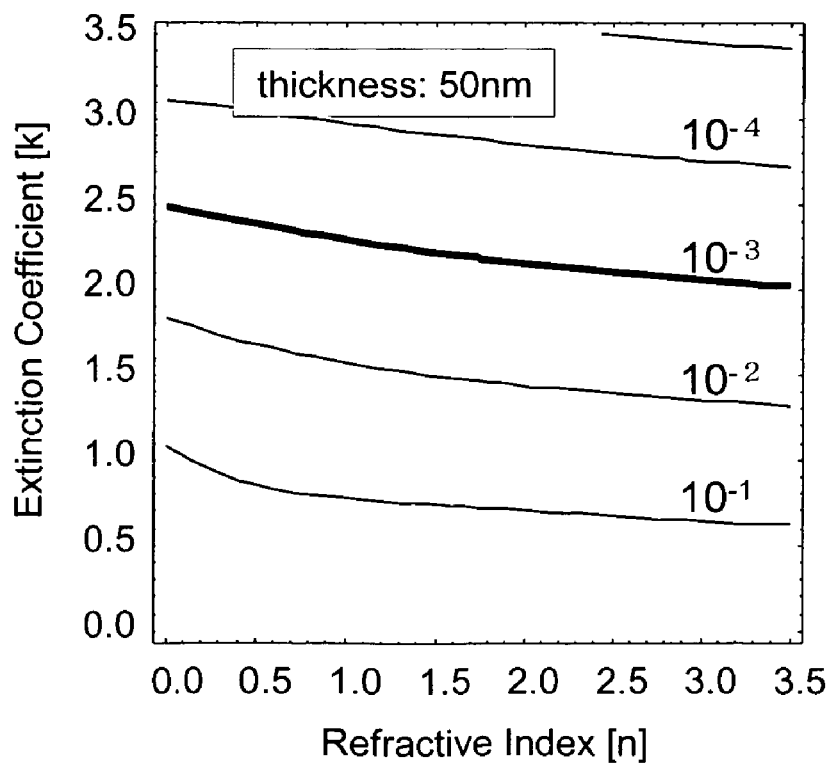
FIG. 12B illustrates a plot of the extinction coefficients versus refractive index for the example of a shield layer thickness of 50 nanometers (nm) for various materials, where the roughly horizontal plot lines are transmittance levels.
Figure 14A:
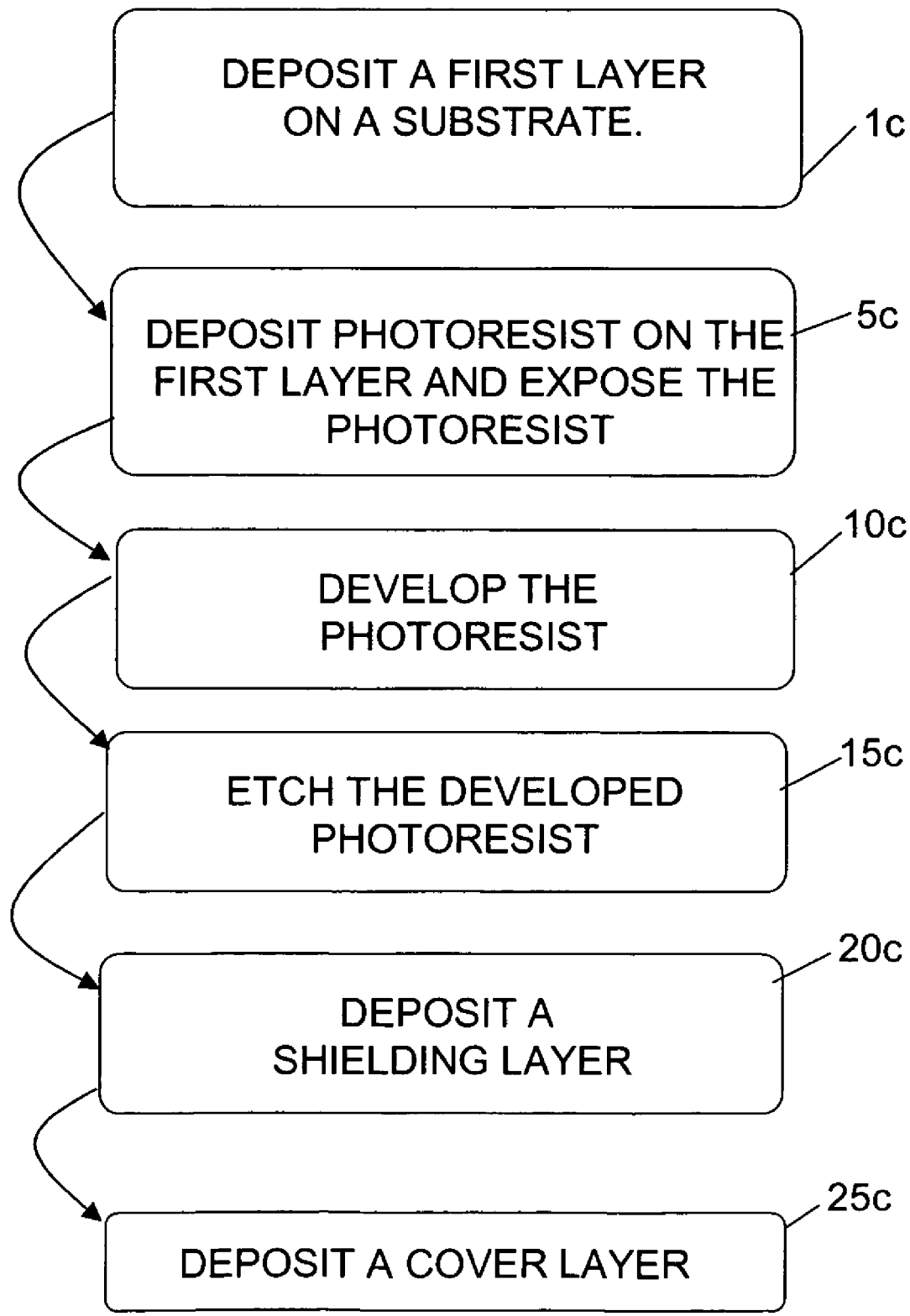
FIG. 14A illustrates a third example of a method of fabricating a detection aperture in accordance with at least one exemplary embodiment.
Figure 14B:
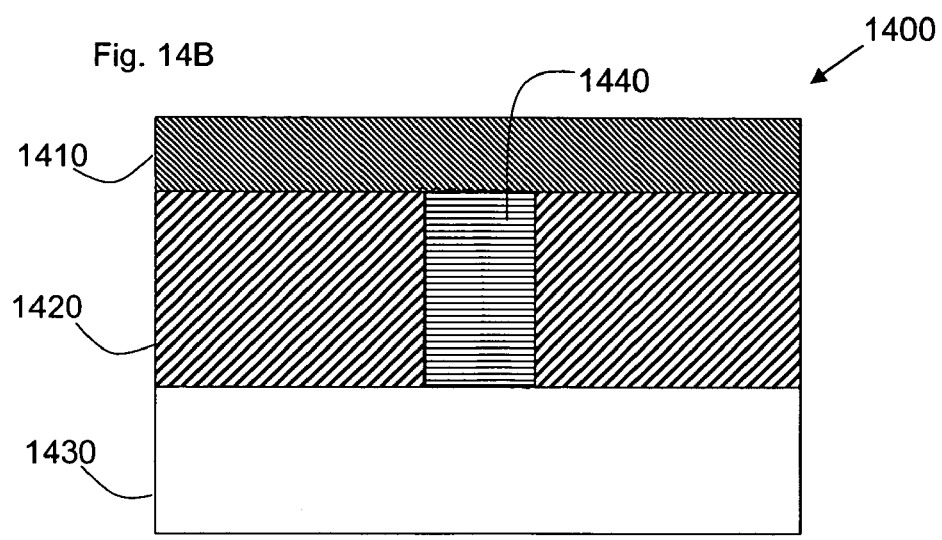
FIG. 14B illustrates an example of a detection aperture, in accordance with at least one exemplary embodiment, fabricated in accordance with the method illustrated in FIG. 14A.
Figure 14C:
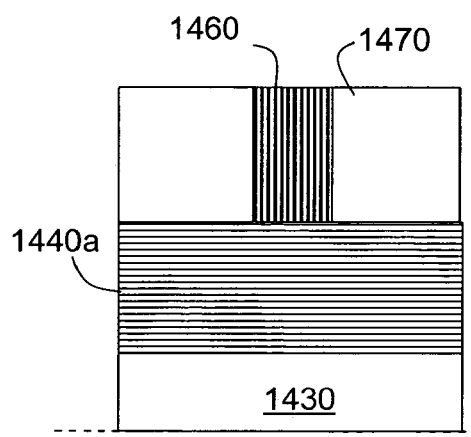
FIGS. 14C-14F illustrate several steps of the method illustrated in FIG. 14A.
Figure 14D:
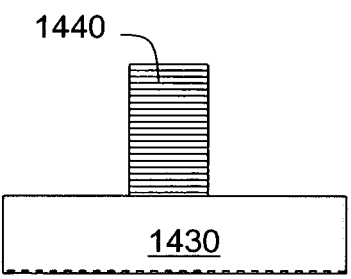
Figure 14E:
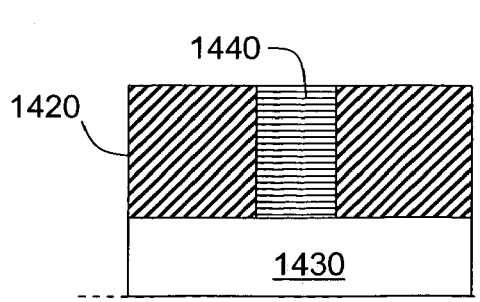
Figure 14F:
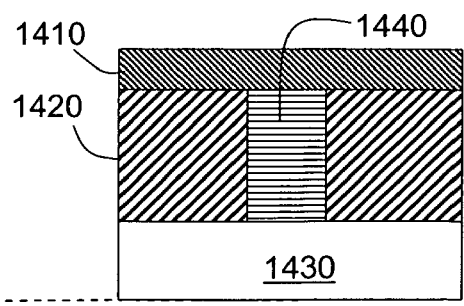
Figure 15A:
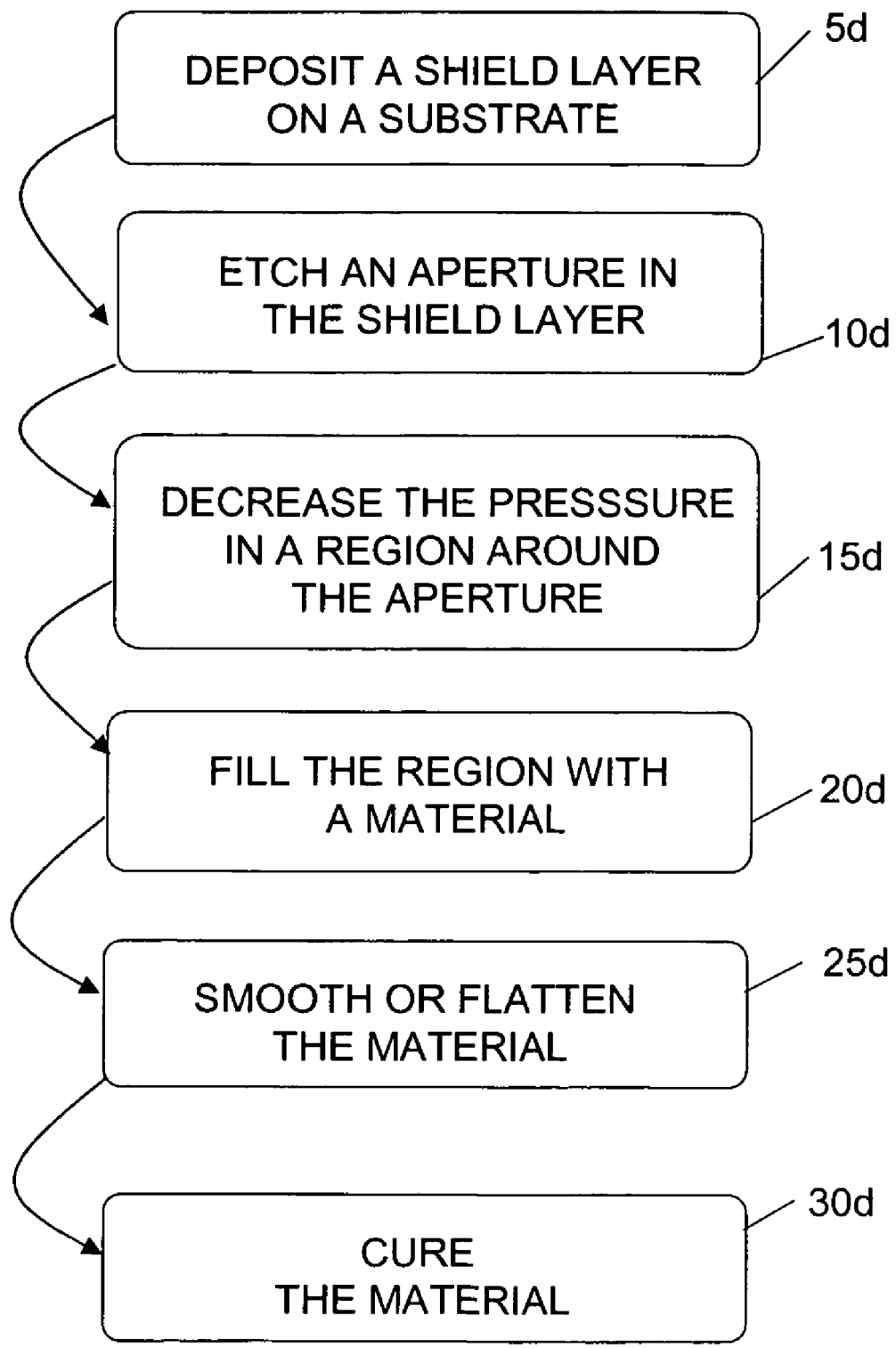
FIG. 15A illustrates a fourth example of a method of fabricating a detection aperture in accordance with at least one exemplary embodiment.
Figure 15B:
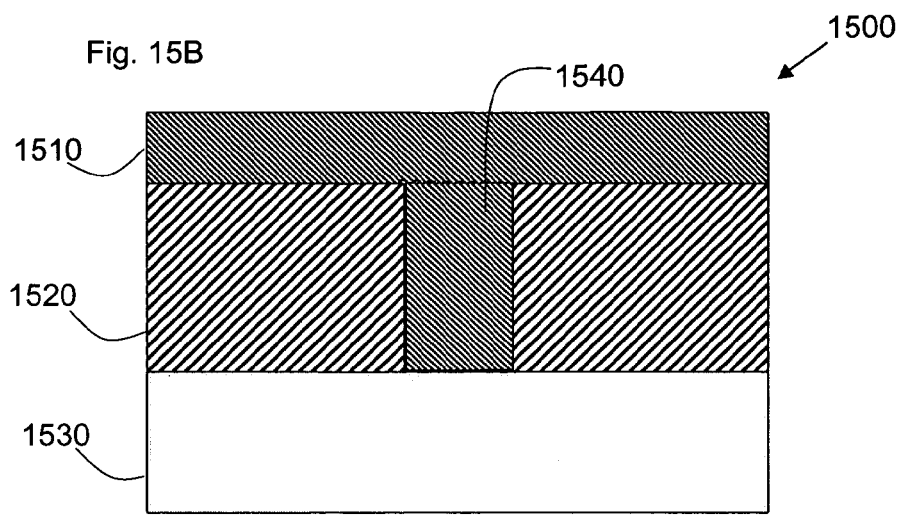
FIG. 15B illustrates an example of a detection aperture, in accordance with at least one exemplary embodiment, fabricated in accordance with the method illustrated in FIG. 15A.
Figures 15C, 15D:
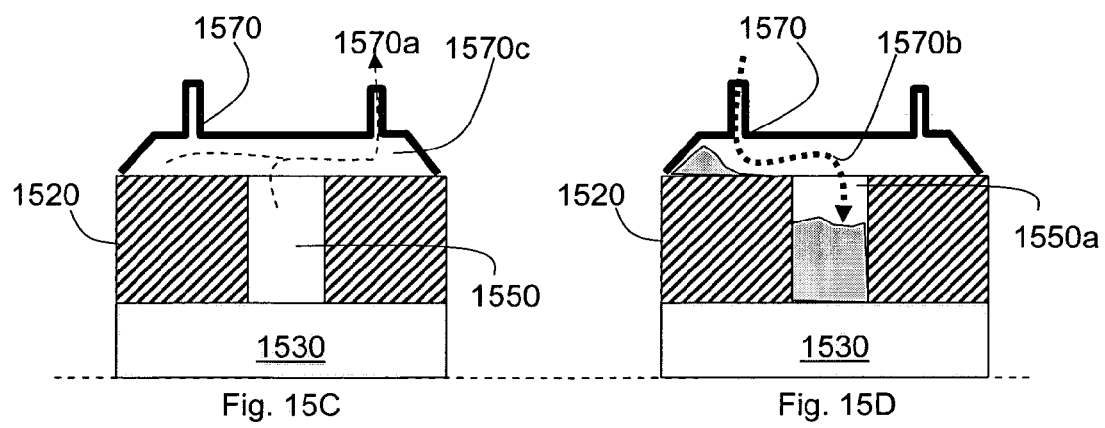
FIGS. 15C-15F illustrate several steps of the method illustrated in FIG. 15A.
Figures 15E, 15F:
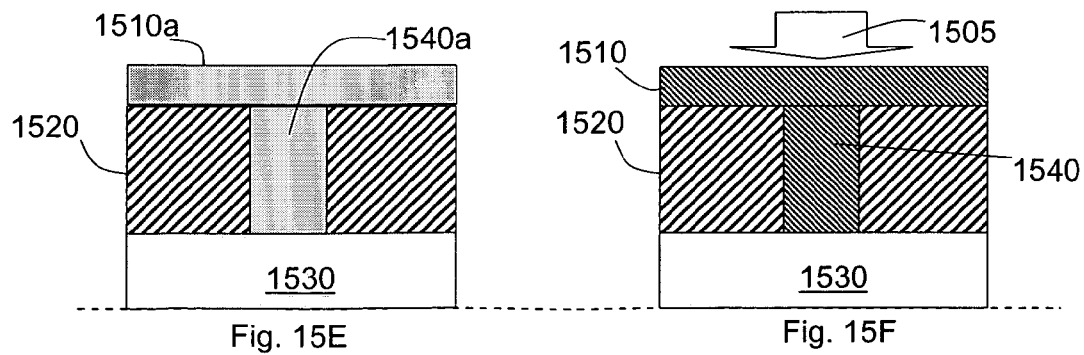

FIG. 12B illustrates another example of a plot of the extinction coefficients versus refractive index for a shield layer thickness of 50 nanometers (nm) for various materials, where the roughly horizontal plot lines are transmittance levels. Again the bold line represents an arbitrary design criterion of 0.001 transmission level through the shield layer. The materials with extinction coefficients above the solid line provide transmission levels less than or equal to the selected criteria of 0.001 transmission level. For example Si, amongst other materials as known by one of ordinary skill in the relevant arts and equivalents would provide extinction coefficient values above the approximately 2.5 needed for a shield layer thickness of 50 nm. Thus the thickness of the shield layer and a selected transmission value can be determinative of the material used in the shield layer. Once the shield layer thickness and material are determined the material to insert into the aperture to vary the effective index of refraction of the aperture can be chosen.

FIGS. 13A and 13B, illustrate two examples in accordance with the second exemplary embodiment where the aperture properties (e.g., the effective refractive index) are chosen to increase the relative transmittance of the TE mode over the TM mode.

FIG. 13A illustrates a first example of a detection aperture 1300*a* in accordance with the second exemplary embodiment, where the shield layer 1320 thickness is 80 nm and the aperture width is 45 nm. As discussed with respect to FIG. 9, various materials can be chosen to provide a chosen (e.g., 0.001) transmittance level through the shield layer 1320 (e.g., Cr). In the example illustrated, the cover layer 1310 (e.g., SiO2) is next to adjacent material 1305 (e.g., water), while the support layer 1330 (e.g., SiO2) is operatively connected to the shield layer 1320. The medium used to fill in the aperture 1350 can be varied to vary the respective transmittance levels of the TE and TM modes. FIG. 13B illustrates the relative transmittance of TE and TM polarizations as a function of material inserted into the aperture of the example illustrated in FIG. 13A. Using AlN as the medium inserted into the aperture (e.g., the second aperture medium 560) provides a higher transmittance level of the TE mode (0.793) compared to the TM mode (0.007) than when air is used, which provides transmittance values of 0.052 and 0.235 respectively.

FIG. 13C illustrates a second example of a detection aperture 1300b in accordance with the second exemplary embodiment, where the shield layer thickness is 50 nm with an aperture width of 45 nm. As discussed above fewer materials have the higher extinction coefficient (e.g., Si), relative to that required for the 80 nm shield layer thickness, needed to maintain a transmittance level of less than or equal to a chosen maximum value (e.g., 0.001 transmittance) through the shield layer. Note that the smaller thickness value of the aperture region, and thus the material inserted into the aperture to vary the effective index of refraction, also varies the transmittance value. For example in the example illustrated in FIG. 3C AlN is inserted into the aperture at a thickness t1=80 nm, providing a transmittance value of 0.793 for the TE mode. Insertion of the same material but at a thickness t1=50 nm increases the transmittance value of the TE mode to 0.975. Notice however that the ration of transmittance of TE/TM decreases from approximately 15 in the second example to approximately 113 in the first example. FIG. 13D illustrates the relative transmittance of TE and TM polarizations as a function of material for the example illustrated in FIG. 13C. Thus one can make a design decision as to whether the ratio of TE/TM transmittance is more important than the transmittance value of the TE mode.

FIGS. 14A-14F illustrates an example of a detector aperture 1400 and a method of fabricating the detection aperture in accordance with at least one exemplary embodiment. A first substrate 1440a is deposited (1c) on a support layer 1430. A photoresist (e.g., positive or negative photoresist) is deposited 5c (e.g., 1470) and exposed (e.g., 1460) on the first substrate 1440a using illumination and a reticle as described generally above in the background section. The exposed photoresist is then developed (10c) and etched (15c) to form a structure 1440 in the first substrate 1440a. A shield layer 1420 is deposited (20c) on the support layer 1430 and around and/or on the structure 1440. Finally a cover layer 1410 is laid (25c) on the shield layer 1420 covering the structure 1440, where the structure 1440 is now referred to as an aperture.

FIGS. 15A-15F illustrates an example of a detector aperture 1500 and a method of fabricating the detection aperture 1500 in accordance with at least one exemplary embodiment. A first substrate is deposited (5d) on a second substrate 1530 where the second substrate is a support layer and the first substrate will become a shield layer 1520. A photoresist is deposited on the first substrate, exposed and etched (10d) to form a recess 1550 (e.g., aperture) in the first substrate. The etched first substrate is referred to as the shield layer 1520. A vacuum or pressure reducing device 1570 is operatively connected to a region 1570c that includes at least a portion of one side of the shield layer 1520 and the recess 1550. The device 1570 evacuates or reduces the pressure (15d) in the region 1570c in at least some of the pressure 1570a in the region 1570c and then injects (20d) 1570b into the region a material that eventually fills 1550a the recess 1550 forming an uncured aperture material 1540a. Additionally the injected material can form an uncured third substrate 1510a, on the shield layer 1520. The uncured third substrate 1510a can be smoothed or flattened (25d) (e.g., flattened by spinning), then cured (30d) to form a cover layer 1510 and aperture material 1540. The step of curing can be via illumination, heating, or via a chemical reaction (adding some chemical to the uncured layer to stimulate a chemical reaction), for example if the material is dimethyl siloxane (silicon oil) the step of curing can be to illuminate the dimethyl siloxane with light from a Xe2 lamp to convert the dimethyl siloxane to SiO2 (glass). Note that the uncured material 1510a and 1540a can be any material that is curable and injectionable, for example dimethyl siloxane (silicon oil), photoresist, and other types of curable material as known by one of ordinary skill in the relevant art and equivalents.

As discussed above with respect to the first exemplary embodiment, further exemplary embodiments are not limited to a detection aperture having only one aperture. Multiple apertures are intended to lie within the scope of the exemplary embodiments. FIG. 16 illustrates an example of a detection aperture 1600 in accordance with at least one exemplary embodiment. An image 1610 carried by image light is incident on a cover layer 1610, which covers a shield layer 1620. The shield layer contains a plurality of apertures 1650, which can be filled with material, either fully or partially in accordance with at least one exemplary embodiment. The shield layer rests on a support layer 1630 through which the light passing through the apertures 1650 can pass. The light can be collimated by a lens 1670, which can then pass through a polarizer to sensor 1660 of a detector. The entire detector aperture 1600 can be moved 1690 in a scanning direction.

In summary a detector aperture in accordance with the second exemplary embodiment is similar to the first exemplary embodiment, which can include a shield layer and an aperture, where the aperture is placed in the shield layer, and where the aperture has a first portion filled with a first medium, where the first medium changes the effective index of refraction within the aperture, and where the effective index of refraction facilitates the increased transmission of light polarized in the TE mode to pass through the aperture.

Further detector apertures in accordance with the second exemplary embodiment can include a cover layer, and a support layer. In at least one exemplary embodiment the cover layer can have one side exposed to a fluid medium (e.g., air, water) or vacuum.

Third Exemplary Embodiment

Figure 3A:
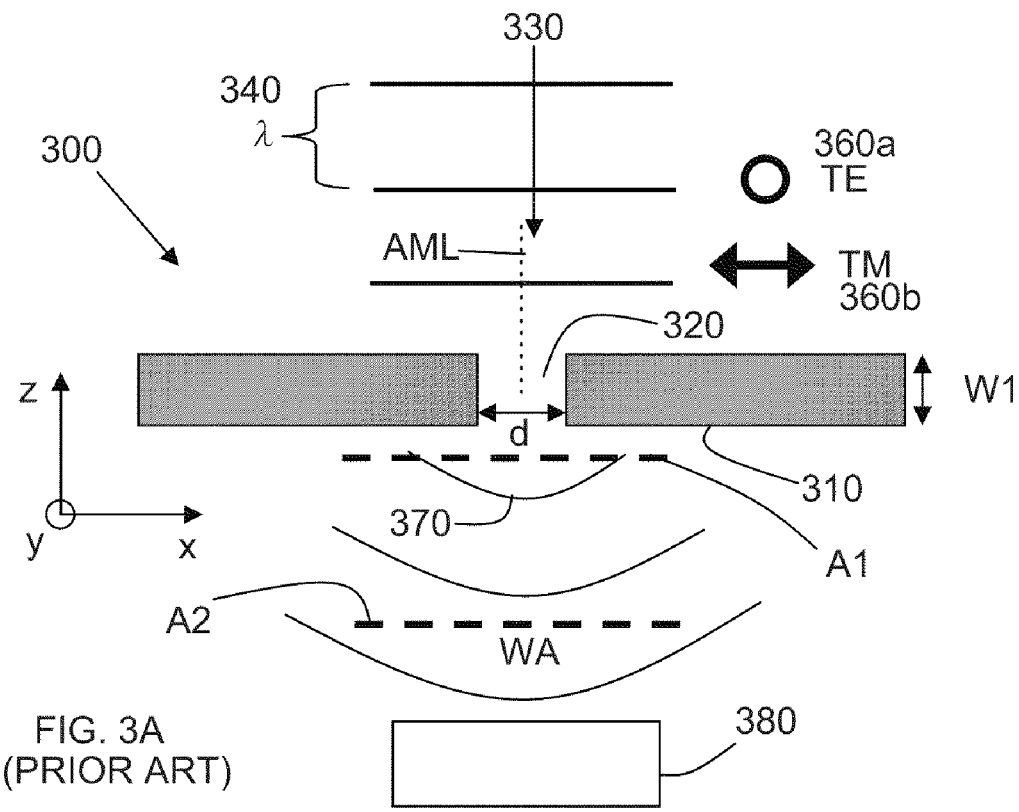
FIG. 3A illustrates the diffraction of image light through a narrow aperture.
Figure 3B:
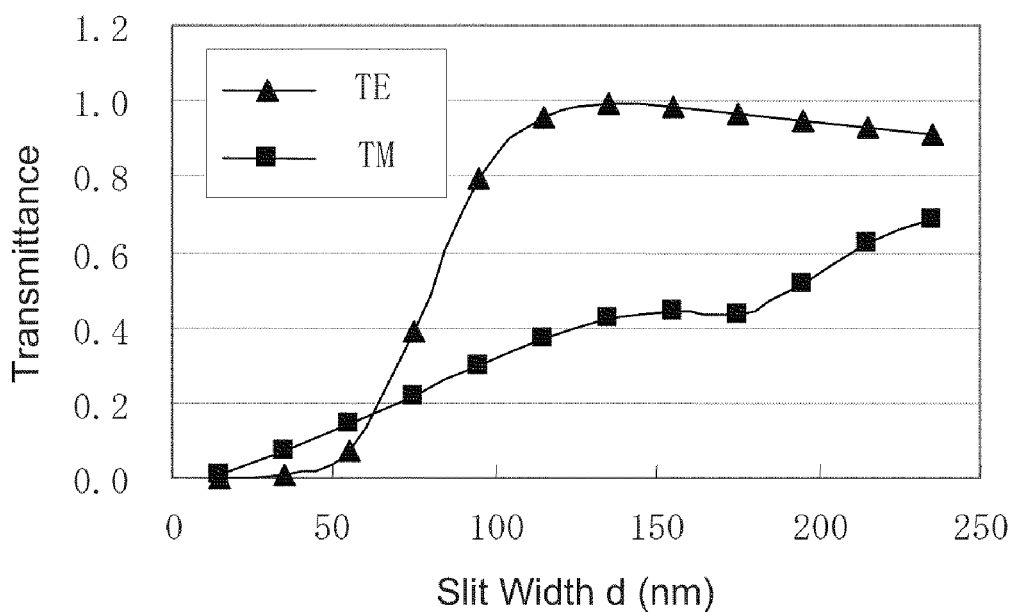
FIG. 3B illustrates the relative transmittance of TE and TM polarized image light through the narrow aperture illustrated in FIG. 3A.
Figure 3C:
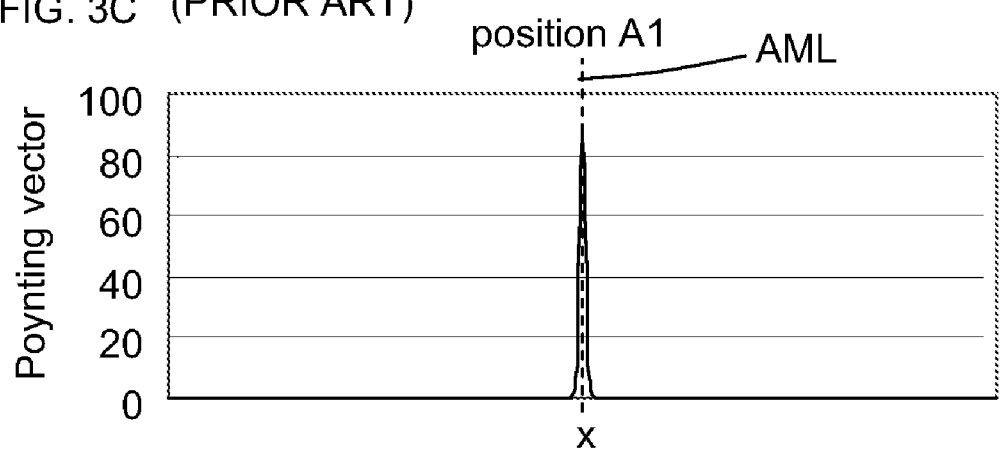
FIG. 3C illustrates the Poynting vector intensity, passing through the narrow aperture illustrated in FIG. 3A, as a function of spatial dimension at an observing position A1.
Figure 3D:
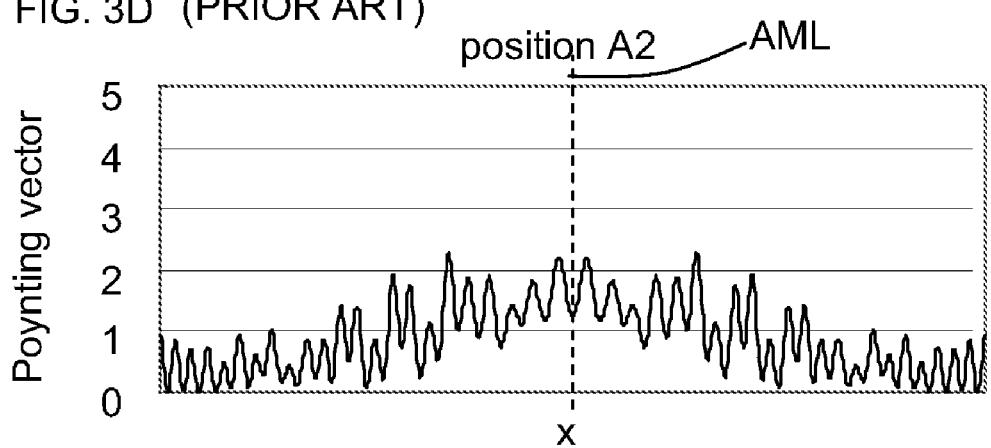
FIG. 3D illustrates the Poynting vector intensity, passing through the narrow aperture illustrated in FIG. 3A, as a function of spatial dimension at an observing position A2.

The third exemplary embodiment is directed to a detection aperture that substantially reduces the effect of diffraction of light through the aperture by adjusting the relative index of refraction between the aperture and a subsequent layer, improving the detected resolution and/or intensity of the sampled image. As illustrated in FIGS. 3C and 3D, diffraction decreases and spreads out the Poyntingvector of the sampled image light passing through the aperture. The third exemplary embodiment is directed to forming structures in the support substrate, where the structures scatter or redirect the diffracted image light, reducing the spread of the Poynting vector measured by the detector (e.g., at position A2).

FIG. 17A illustrates a first example of a detection aperture 1700 in accordance with a third exemplary embodiment. The detection aperture 1700 can include an adjacent material 1710; a cover layer 1720, the shield layer 1730, and a medium filled aperture 1750 within the shield layer 1730 having a thickness of "h." In the first example illustrated in FIG. 17A, two structures are provided 1760 and 1770, having widths d1 and d3 (see FIG. 17A) respectively with thickness values of h1. The first structure 1760 and second structure 1770 can be separated by a spacing distance d2. The thickness h, h1, widths d1 and d3, and the spacing distance d2 can be varied to vary the Poynting vector plot of the detected image light at a chosen detector offset (e.g., position A2). Note that the first example can further include a support layer 1540 in which the structures can be formed.

Figure 17B:
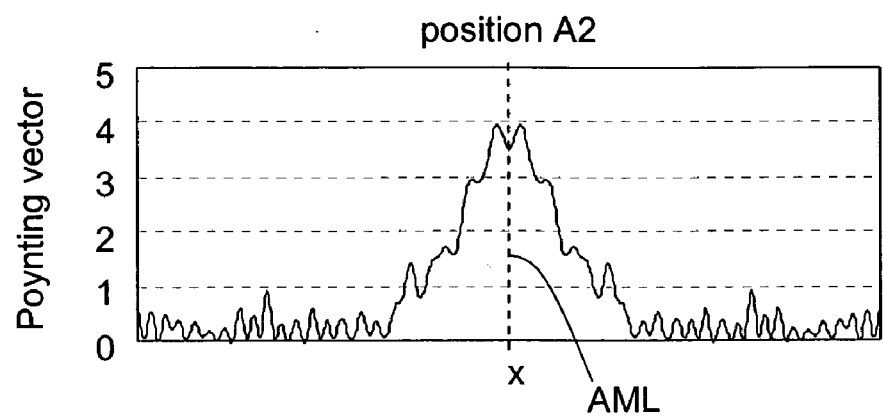
FIG. 17B illustrates the Poynting vector intensity as a function of spatial dimension at the observing position A2 with respect to the detection aperture illustrated in FIG. 17A.

FIG. 17B illustrates the Poynting vector intensity as a function of spatial dimension at the observing position A2 with respect to the detection aperture illustrated in FIG. 17A. Note that the addition of the first 1760 and second 1770 structure can facilitate scattering by the structures of the diffracted image light, which then increases the Poynting vector intensity, and symmetry about the AML, and the SN ratio. Note the comparison between FIG. 3D without structures and FIG. 17B with structures.

Figure 17C:
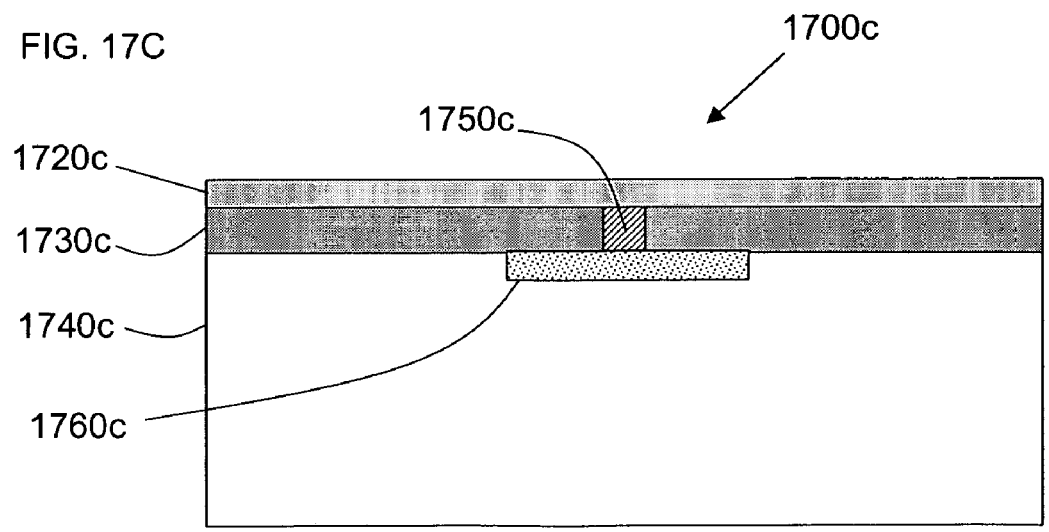

FIGS. 17C through 17H illustrate further examples of detection apertures in accordance with the third exemplary embodiment. FIG. 17C illustrates a second example of a detector aperture 1700c in accordance with a third exemplary embodiment. This example also can include a cover layer 1720c, a shield layer 1730c, and aperture 1750c, a support layer 1740c, and a condenser element 1760c. In this example, instead of structures (e.g., 1760 and 1770) scattering incident diffracted image light, a condenser (redirecting) element 1760b refocuses the diffracted image light increasing the detected intensity and resolution. The condenser element 1760c can be a redirecting layer (e.g., having a different index of refraction than that of the aperture or a micro/nano lens (e.g., a layer having an index of refraction greater than the shield layer and aperture)). The condenser element 1760c can be a layer having a different index of refraction than that of the aperture or a micro/nano lens (e.g., a layer having an index of refraction greater than the shield layer and aperture).

Figure 17D:
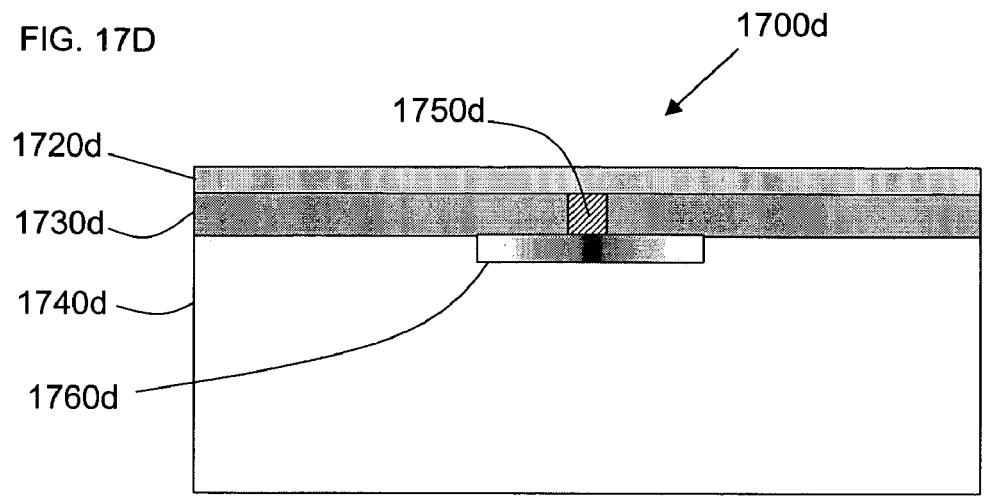
Figure 17E:
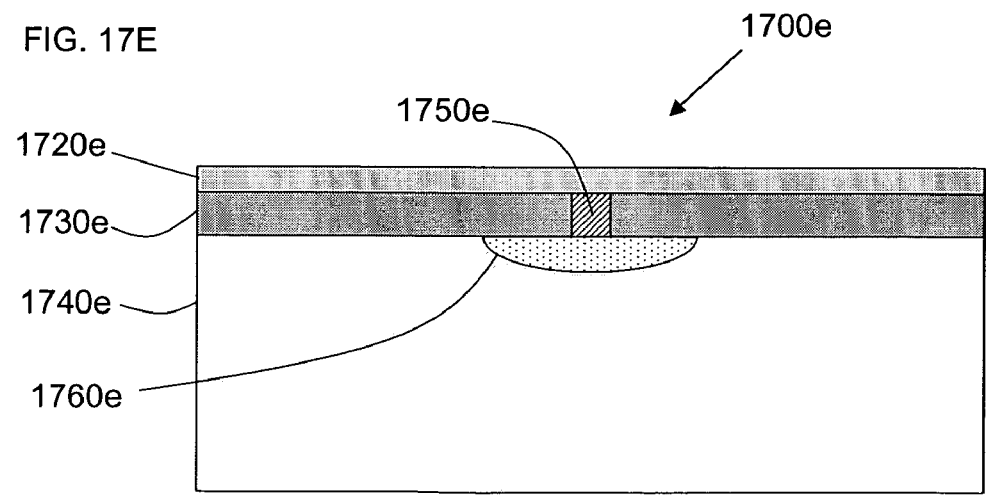

FIGS. 17D and 17E further illustrate a third and fourth example of detector apertures 1700d and 1700e in accordance with the third exemplary embodiment. These examples also can include a cover layer 1720d-e, a shield layer 1730d-e, and aperture 1750d-e, a support layer 1740d-e, and a condenser element (redirecting layer) 1760d-e. In these examples, instead of the homogenous condenser element 1760c illustrated in FIG. 17C, the third example illustrates a gradient index condenser element 1760d, while the fourth example illustrates a lens as the condenser element 1760e. In at least one exemplary embodiment the gradient index condenser element 1760d can have a central index of refraction greater than the substrate, with end index of refractions matching that of the substrate. The areas between can gradually or sharply changed the index of refraction between the center and the ends. The lens condenser element 1760e can be of various shapes and sizes depending upon the materials and wavelengths used.

Figure 17F:
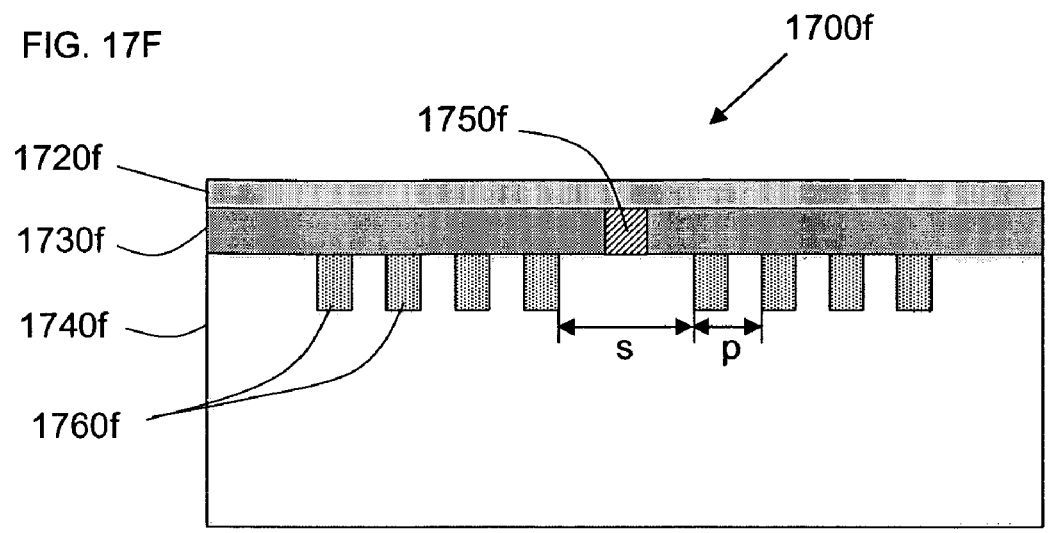

FIG. 17F illustrates a fifth example of a detector aperture 1700f in accordance with the third exemplary embodiment. In this example multiple structures 1760f in the support layer 1740f, having pitch (p) between structures 1760f on one side of the aperture 1750f, and a spacing distance s between the first structures on either side of the aperture 1750f, can be used to increase the amount of scattering of the diffracted transmitted image light.

Figure 17G:
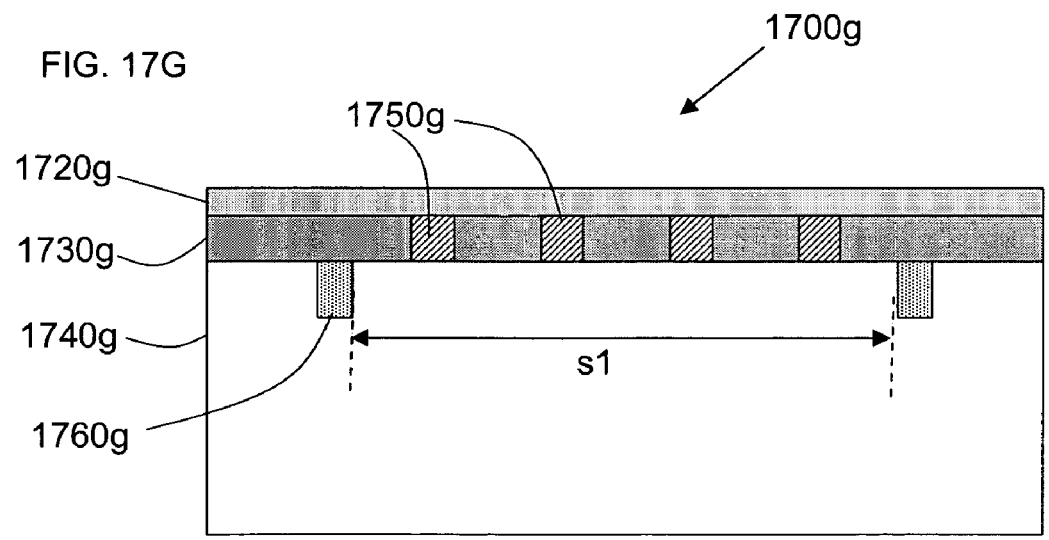

FIG. 17G illustrates a sixth example of a detector aperture 1700g in accordance with the third exemplary embodiment. In this example only two structures 1760g, separated by a spacing distance s1, are used in the support layer 1740g having multiple apertures 1750g. The two structures 1760g scatter the diffracted transmitted image light.

FIG. 17H provides yet another example, a seventh example, of a detector aperture 1700h in accordance with the third exemplary embodiment. In this particular example a multiple number of structures 1760h are positioned to either side of a plurality of apertures 1750h. The multiple structures provide more uniform scattering across the detector position.

In summary a detector aperture in accordance to the third exemplary embodiment can include a shield layer; a substrate (e.g., support layer) operatively connected to one side of the shield layer; at least two structures in the substrate or at least one condensing element; and at least one aperture, where each aperture has an associated aperture midline, where the at least one aperture is placed in the shield layer, where image light is diffracted upon passing through the at least one aperture, where the diffracted light is scattered by the at least two structures or redirected by the condenser element so that the Poynting vector distribution about one of the aperture midlines at an observation distance has an improved localization. Note also that a combination of structures and condensing elements can be used.

Additionally the detector aperture in accordance with the third exemplary embodiment, can further have the at least two structures comprising: a first and second structure, where the first structure is positioned on one side of an aperture midline and the second structure is positioned on the opposite side of the aperture midline, and where the first and second structures are separated by a spacing distance.

The at least two structures can further comprise, in accordance with the third exemplary embodiment, multiple structures. For example the at least two structures can comprise: a first and second structure to one side of an aperture midline; and a third and fourth structure to the opposite side of the aperture midline as the first and second structure, where the first and second structure are separated by a first pitch distance, where the third and fourth structure are separated by a second pitch distance, and where the first and third structures, positioned as the first structures on either side of the aperture, are separated by a spacing distance.

Additionally at least one detector aperture in accordance with the exemplary embodiments discussed, can comprise multiple apertures.

At least one exemplary embodiment can have at least one aperture filled with at least one of AlN, SiO2, Cr2O3, HfO2, and Si3N4.

A detector aperture in accordance with the third exemplary embodiment can have the structures made of various materials, for example Cr, Si, Mo, Ta, W, Rh, MoN, NbN, other materials as known by one of ordinary skill in the relevant art and equivalents. Additionally the spacing distances between structures can vary (e.g., 50 nm to 500 nm, 100 to 300 nm, or other ranges according to the particulars of a design). Further detector apertures in accordance with the third exemplary embodiment can have various pitch distance values (e.g., 25 nm, 50 nm, 100 nm, 200 nm, 300 nm, 500 nm, or other distances according to the particulars of a design) including where the first pitch distance between a first group of structures is about equal to a second pitch distance between a second group of structures. In accordance with the third exemplary embodiment the thicknesses of the structures can vary (e.g., from 25 nm to 500 nm) and so can he widths (e.g., from 25 nm to 500 nm).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions. For example, if words such as "orthogonal", "perpendicular" are used the intended meaning is "substantially orthogonal" and "substantially perpendicular" respectively. Additionally although specific numbers may be quoted in the claims, it is intended that a number close to the one stated is also within the intended scope, i.e. any stated number (e.g., 90 degrees) should be interpreted to be "about" the value of the stated number (e.g., about 90 degrees).

Thus, the description of the invention is merely exemplary in nature and, thus, variations that do not depart from the gist of the invention are intended to be within the scope of the embodiments of the present invention. Such variations are not to be regarded as a departure from the spirit and scope of the present invention.

What is claimed is:

1. A detection aperture comprising:
   a shield layer;
   an aperture, wherein the aperture is placed in the shield layer, and wherein the aperture has a first portion filled with a first medium, wherein the first medium changes the effective index of refraction within the aperture, and wherein the effective index of refraction facilitates the passage of incident image light polarized in both the TM and TE modes to pass through the aperture with about the same transmittance level;
   a support layer, wherein the support layer is operatively connected to a side of the shield layer between incident image light and the shield layer; and
   a cover layer, wherein the cover layer is operatively connected to a side of the shield layer opposite the side the support layer is operatively connected to.

2. The detection aperture according to claim 1, wherein the effective index of refraction within the aperture is higher than 1 and lower than that of the support layer.

3. The detection aperture according to claim 1, wherein the cover layer has one side exposed to a fluid medium.

4. The detection aperture according to claim 3, wherein the fluid is one of air and a vacuum.

5. The detection aperture according to claim 3, wherein the fluid is water or a material with an index of refraction about that of water or higher.

6. The detection aperture according to claim 1, wherein the first medium includes nanoparticles.

7. The detection aperture according to claim 6, wherein the nanoparticles are nanospheres.

8. The detection aperture according to claim 6, wherein the nanoparticles are nanocolumns.

9. The detection aperture according to claim 6, wherein the nanoparticles form a nano-porous structure.

10. The detection aperture according to claim 1, wherein the first medium is at least one of SiO2, LiF, and MgF2.

11. The detection aperture according to claim 1, wherein the shield layer is made from a shield medium, wherein the shield medium is at least one of Cr, Si, Mo, Ta, W, Rh, MoN, and NbN.

12. The detection aperture according to claim 11, wherein the thickness of the shield layer is between 25-100 nm.

13. The detection aperture according to claim 12, wherein the shield medium is chosen based upon which material provides a lower transmission of TE and TM polarized light through the shield layer for a given thickness.

14. A detection aperture layer comprising:
    a plurality of detection apertures according to claim 1, wherein the plurality of apertures have a common shield layer and wherein the apertures of the plurality of detection apertures are spaced in the shield layer.

15. The detection aperture according to claim 1, wherein the aperture is a slit.

16. A detection aperture comprising:
    a shield layer; and
    an aperture, wherein the aperture is placed in the shield layer, and
    wherein the aperture has a first portion filled with a first medium, wherein the first medium changes the effective index of refraction within the aperture, and wherein the effective index of refraction facilitates the increased transmission of light polarized in the TE mode to pass through the aperture with the transmission of TM modes reduced.

17. The detection aperture according to claim 16, further comprising:
    a support layer, wherein the support layer is operatively connected to a side of the shield layer between incident image light and the shield layer.

18. The detection aperture according to claim 17, further comprising:
    a cover layer, wherein the cover layer is operatively connected to a side of the shield layer opposite the side the support layer is operatively connected to.

19. The detection aperture according to claim 18, wherein the effective index of refraction within the aperture is equal to or higher than that of the support layer.

20. The detection aperture according to claim 18, wherein the cover layer has one side exposed to a fluid medium.

21. The detection aperture according to claim 20, wherein the fluid is one of air and a vacuum.

22. The detection aperture according to claim 20, wherein the fluid is a material with an index of refraction about that of water or higher.

23. The detection aperture according to claim 18, wherein the first medium is at least one of AlN, SiO2, Cr2O3, HfO2, and Si3N4.

24. The detection aperture according to claim 18, wherein the shield layer is made from at least one of Cr, Si, Mo, Ta, W, Rh, MoN, and NbN.

25. The detection aperture according to claim 24, wherein the thickness of the shield layer is between 25-100 nm.

26. The detection aperture according to claim 25, wherein the shield medium is chosen based upon which material provides a lower transmission of TE and TM polarized light through the shield layer.

27. A detection aperture layer comprising:
    a plurality of detection apertures according to claim 18, wherein the plurality of apertures has a common shield layer and wherein the apertures of the plurality of detection apertures are spaced in the shield layer.

28. The detection aperture according to claim 16, wherein the aperture is a slit.

29. A detection aperture comprising:
    a shield layer;
    a substrate operatively connected to one side of the shield layer;
    at least two structures in the substrate; and
    at least one aperture, wherein each aperture has an associated aperture midline, wherein the at least one aperture is placed in the shield layer, wherein image light is diffracted upon passing through the at least one aperture, wherein the diffracted light is scattered by the at least two structures so that the Poynting vector distribution about one of the aperture midlines at an observation distance has an improved localization.

30. The detection aperture according to claim 29, wherein the at least two structures comprises:
    a first and second structure, wherein the first structure is positioned on one side of at least one aperture midline and the second structure is positioned on the opposite side of the aperture midline, and wherein the first and second structure are separated by a spacing distance.

31. The detection aperture according to claim 30, wherein the spacing distance is between 100 to 300 nm.

32. The detection aperture according to claim 29, wherein the at least two structures comprises:

a first and second structure to one side of at least one aperture midline; and a third and fourth structure to the opposite side of the aperture midline as the first and second structure, wherein the first and second structure are separated by a first pitch distance, wherein the third and fourth structure are separated by a second pitch distance, and wherein the first and third structures, positioned as the first structures on either side of the aperture, are separated by a spacing distance.

33. The detection aperture according to claim 32, wherein the first pitch distance and the second pitch distance are about equal.

34. The detection aperture according to claim 33, wherein the first pitch distance is between 100 to 300 nm.

35. The detection aperture according to claim 32, wherein the thicknesses of the first structure and the second structure is between 50 to 200 nm.

36. The detection aperture according to claim 35, wherein the widths of the first structure and the second structure is between 30 to 100 nm.

37. The detection aperture according to claim 29, wherein the at least one aperture comprises:
a plurality of apertures, wherein to one side of the plurality of apertures is a first structure and to the opposite side of the plurality of apertures from the first structure is a second structure.

38. The detection aperture according to claim 29, wherein the at least one aperture is filled with at least one of AlN, SiO2, Cr2O3, HfO2, and Si3N4.

39. The detection aperture according to claim 38, wherein the first and second structure is made from at least one of Cr, Si, Mo, Ta, W, Rh, MoN, and NbN.

40. The detection aperture according to claim 29, wherein the aperture is a slit.

41. A detection aperture comprising:
a shield layer;
a substrate operatively connected to one side of the shield layer;
a redirecting layer; and
at least one aperture, wherein each aperture has an associated aperture midline, wherein the at least one aperture is placed in the shield layer, wherein image light is diffracted upon passing through the at least one aperture, wherein the diffracted light is directed by the redirecting layer so that the Poynting vector distribution about one of the aperture midlines at an observation distance has an improved localization.

42. The detection aperture according to claim 41, wherein the redirecting layer is a layer having a higher index of refraction than the substrate.

43. The detection aperture according to claim 41, wherein the redirecting layer is a layer having a gradient index of refraction.

44. The detection aperture according to claim 43, wherein the redirecting layer has a central position index of refraction greater than that of the substrate and has an end position index of refraction about that of the substrate.

45. The detection aperture according to claim 44, wherein the index of refraction varies gradually from the central to the end position.

46. The detection aperture according to claim 41, wherein the redirecting layer is a lens.

47. The detection aperture according to claim 41, wherein the aperture is a slit.

48. A method of fabrication of a detection aperture comprising:
depositing a photoresist on a substrate;
developing the photoresist on the substrate;
etching the photoresist and the substrate, wherein the etching the photoresist creates a protrusion on the substrate, wherein the protrusion acts as an inserted material into an aperture to adjust the effective index of refraction of the aperture;
depositing a shield layer on the etched substrate; and
depositing a cover layer on the shield layer.

49. The method according to claim 47, further comprising:
depositing a second photoresist on the shield layer;
developing the second photoresist; and
etching the developed second photoresist and shield layer, wherein a portion of the etched shield layer and the protrusion form the aperture, and wherein the cover layer on the etched shield layer encloses an aperture in the shield layer.

50. A method of fabrication of a detection aperture comprising:
depositing a first substrate on a second substrate;
depositing a photoresist on the first substrate;
developing the photoresist on the first substrate;
etching the photoresist and the first substrate forming an etched recess in the first substrate extending to the second substrate;
depositing nanoparticles into the etched recess; and
laying a cover layer on the etched shield layer, forming an enclosed aperture in the shield layer, wherein a portion of the aperture is filled with the nanoparticles, altering the effective index of refraction in the aperture.

51. A method of fabrication of a detection aperture comprising:
depositing a shield layer on a substrate;
depositing a photoresist on the shield layer;
developing the photoresist on the shield layer;
etching the photoresist and the shield layer forming an etched recess in the shield layer extending to the substrate;
decreasing the pressure of a region around the recess and a portion of one side of the shield layer;
injecting a material into a portion of the region;
smoothing the material; and
curing the material.

52. The method according to claim 51, wherein the material is a fluid that can be cured.

53. The method according to claim 52, wherein the fluid is dimethyl siloxane and upon the step of curing the resultant material includes SiO2.

54. The method according to claim 53, wherein the step of curing the material includes irradiating the dimethyl siloxane with a Xe2 lamp.

55. The method of fabrication according to claim 48, 50, or 51, further comprising:
etching at least two recesses in the substrate and filling the recesses with a material so that the filled recesses form at least two scattering structures.

* * * * *